United States Patent
Shimizu et al.

(10) Patent No.: US 8,211,616 B2
(45) Date of Patent: Jul. 3, 2012

(54) POSITIVE RESIST COMPOSITION AND METHOD OF FORMING RESIST PATTERN

(75) Inventors: Hiroaki Shimizu, Kawasaki (JP);
Tsuyoshi Nakamura, Kawasaki (JP);
Yoshiyuki Utsumi, Kawasaki (JP);
Keita Ishiduka, Kawasaki (JP);
Kensuke Matsuzawa, Kawasaki (JP);
Akiya Kawaue, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 291 days.

(21) Appl. No.: 12/500,528

(22) Filed: Jul. 9, 2009

(65) Prior Publication Data
US 2010/0015553 A1    Jan. 21, 2010

(30) Foreign Application Priority Data
Jul. 18, 2008 (JP) ................. 2008-187716

(51) Int. Cl.
G03F 7/039 (2006.01)
G03F 7/20 (2006.01)

(52) U.S. Cl. .............. 430/270.1; 430/311; 430/326

(58) Field of Classification Search .............. None
See application file for complete search history.

(56) References Cited

U.S. PATENT DOCUMENTS

| | | | |
|---|---|---|---|
| 4,080,246 A * | 3/1978 | Battisti et al. ............ | 216/103 |
| 5,945,517 A | 8/1999 | Nitta et al. | |
| 6,153,733 A | 11/2000 | Yukawa et al. | |
| 7,074,543 B2 | 7/2006 | Iwai et al. | |
| 2005/0100819 A1 * | 5/2005 | Fuji et al. ............ | 430/270.1 |
| 2009/0023097 A1 | 1/2009 | Dazai et al. | |
| 2009/0104563 A1 | 4/2009 | Ishiduka et al. | |
| 2009/0130597 A1 | 5/2009 | Seshimo et al. | |
| 2010/0015552 A1 | 1/2010 | Kawaue et al. | |
| 2010/0035185 A1 * | 2/2010 | Hagiwara et al. ........ | 430/286.1 |
| 2010/0086873 A1 | 4/2010 | Seshimo et al. | |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | 2005-037888 | 2/2005 |
| JP | 2006-178172 A * | 7/2006 |
| WO | WO 2004-074242 | 9/2004 |
| WO | WO 2008099869 A1 * | 8/2008 |

OTHER PUBLICATIONS

English translation of JP, 2006-178172, A (2006) from machine translation from AIPN Japan Patent Office National Center for Industrial Property Information and Training, generated Jul. 5, 2011, 71 pages.*
Office Action issued in U.S. Appl. No. 12/758,650 on Jan. 20, 2012.

* cited by examiner

Primary Examiner — Cynthia Hamilton
(74) Attorney, Agent, or Firm — Knobbe Martens Olson & Bear LLP

(57) ABSTRACT

A positive resist composition including a resin component (A) having a structural unit (a0) represented by general formula (a0-1) (R represents a hydrogen atom, a $C_1$-$C_5$ alkyl group or a $C_1$-$C_5$ halogenated alkyl group; $R^1$ represents a $C_3$ or more branched alkyl group; and each of $R^2$ and $R^3$ independently represents an alkyl group, wherein $R^2$ and $R^3$ may be mutually bonded to form a polycyclic group) and/or general formula (a0-2) (R is the same as defined above; $R^8$ represents a divalent linking group that contains no halogen atom; and $R^7$ represents an acid dissociable, dissolution inhibiting group), and an acid generator (B1) consisting of a compound represented by general formula (b1) ($Y^1$ represents a $C_1$-$C_4$ fluorinated alkylene group which may have a substituent; X represents a $C_3$-$C_{30}$ aliphatic cyclic group which may have a substituent; and $A^+$ represents an organic cation).

[Chemical Formula 1]

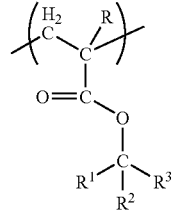

(a0-1)

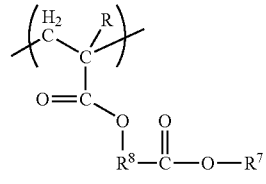

(a0-2)

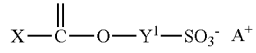

(b1)

5 Claims, No Drawings

POSITIVE RESIST COMPOSITION AND METHOD OF FORMING RESIST PATTERN

TECHNICAL FIELD

The present invention relates to a positive resist composition and a method of forming a resist pattern using the resist composition.

Priority is claimed on Japanese Patent Application No. 2008-187716, filed Jul. 18, 2008, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter than these excimer lasers, such as $F_2$ excimer lasers, electron beam, extreme ultraviolet radiation (EUV), and X-ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in an alkali developing solution under the action of acid and an acid generator that generates acid upon exposure.

For example, a chemically amplified positive resist contains, as a base component (base resin), a resin which exhibits increased solubility in an alkali developing solution under action of acid, and an acid generator is typically used. If the resist film formed using the resist composition is selectively exposed during formation of a resist pattern, then within the exposed portions, acid is generated from the acid generator, and the action of this acid causes an increase in the solubility of the resin component in an alkali developing solution, making the exposed portions soluble in the alkali developing solution.

Currently, resins that contain structural units derived from (meth)acrylate esters within the main chain (acrylic resins) are now widely used as base resins for resists that use ArF excimer laser lithography, as they exhibit excellent transparency in the vicinity of 193 nm (for example, see Patent Document 1).

Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

On the other hand, as acid generators usable in a chemically amplified resist composition, various types have been proposed including, for example, onium salt acid generators such as iodonium salts and sulfonium salts; oxime sulfonate acid generators; diazomethane acid generators; nitrobenzylsulfonate acid generators; iminosulfonate acid generators; and disulfone acid generators.

Currently, as acid generators, onium salt acid generators having an onium ion such as triphenylsulfonium as the cation moiety are used. As the anion moiety for onium salt acid generators, an alkylsulfonate ion or a fluorinated alkylsulfonate ion in which part or all of the hydrogen atoms within the aforementioned alkylsulfonate ion has been substituted with fluorine atoms is typically used (for example, see Patent Document 2).

[Patent Document 1] Japanese Unexamined Patent Application, First Publication No. 2003-241385

[Patent Document 2] Japanese Unexamined Patent Application, First Publication No. 2005-37888

SUMMARY OF THE INVENTION

As further progress is made in lithography techniques and miniaturization of resist patterns, further improvement in the resolution of resist materials has been demanded.

However, when a fine pattern with a narrow pitch, e.g., a hole pattern having a hole diameter of about 100 nm or smaller was formed using a conventional resist composition, there was a problem in that the shape of the pattern collapsed. Therefore, in the formation of a hole pattern using a conventional resist composition, a resist pattern having high circularity and an excellent shape has been demanded.

The present invention takes the above circumstances into consideration, with an object of providing a positive resist composition which enables formation of a resist pattern having an excellent shape, and a method of forming a resist pattern.

For solving the above-mentioned problems, the present inventors propose the following aspects.

Specifically, a first aspect of the present invention is a positive resist composition including a base component (A) which exhibits increased solubility in an alkali developing solution under action of acid and an acid-generator component (B) which generates acid upon exposure, the resin component (A) including at least one structural unit (a0) selected from the group consisting of a structural unit represented by general formula (a0-1) shown below and a structural unit represented by general formula (a0-2) shown below, and the acid-generator component (B) including an acid generator (B1) consisting of a compound represented by general formula (b1) shown below.

[Chemical Formula 1.]

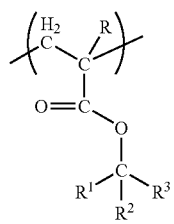
(a0-1)

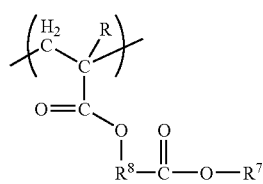
(a0-2)

In formula (a0-1), R represents a hydrogen atom, a lower alkyl group of 1 to 5 carbon atoms or a halogenated lower alkyl group of 1 to 5 carbon atoms; $R^1$ represents a branched alkyl group of 3 or more carbon atoms; and each of $R^2$ and $R^3$ independently represents an alkyl group, wherein $R^2$ and $R^3$ may be mutually bonded to form a polycyclic group. In general formula (a0-2), R represents a hydrogen atom, a lower alkyl group of 1 to 5 carbon atoms or a halogenated lower alkyl group of 1 to 5 carbon atoms; $R^8$ represents a divalent linking group that contains no halogen atom; and $R^7$ represents an acid dissociable, dissolution inhibiting group.

[Chemical Formula 2.]

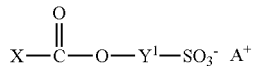
(b1)

In formula (b1), $Y^1$ represents a fluorinated alkylene group of 1 to 4 carbon atoms which may have a substituent; X represents an aliphatic cyclic group of 3 to 30 carbon atoms which may have a substituent; and $A^+$ represents an organic cation.

A second aspect of the present invention is a method of forming a resist pattern, including applying a positive resist composition according to the first aspect on a substrate to form a resist film, subjecting the resist film to exposure, and subjecting the resist film to alkali developing to form a resist pattern.

In the present description and claims, an "alkyl group" includes linear, branched or cyclic, monovalent saturated hydrocarbon, unless otherwise specified.

The term "alkylene group" includes linear, branched or cyclic divalent saturated hydrocarbon, unless otherwise specified.

A "lower alkyl group" is an alkyl group of 1 to 5 carbon atoms.

A "halogenated alkyl group" is a group in which part or all of the hydrogen atoms of an alkyl group is substituted with halogen atoms. Examples of halogen atoms include fluorine atoms, chlorine atoms, bromine atoms and iodine atoms.

the term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

According to the present invention, there are provided a positive resist composition which enable formation of a resist pattern having an excellent shape, and a method of forming a resist pattern using the same.

DETAILED DESCRIPTION OF THE INVENTION

<<Positive Resist Composition>>

The positive resist composition of the present invention includes a base component (A) which exhibits increased solubility in an alkali developing solution under action of acid (hereafter, referred to as "component (A)") and an acid-generator component (B) which generates acid upon exposure (hereafter, referred to as "component (B)").

In the positive resist composition of the present invention, the component (A) is insoluble in an alkali developing solution prior to exposure, and when acid is generated from the component (B) upon exposure, the solubility of the component (A) in an alkali developing solution increases. As a result, the positive resist composition changes from an alkali-insoluble state to an alkali-soluble state. Therefore, in the formation of a resist pattern, when a resist film obtained by using the positive resist composition is subjected to selective exposure, the exposed portions become soluble in an alkali developing solution, while the unexposed portions remain alkali-insoluble, and hence, a resist pattern can be formed by using an alkali developing solution.

<Component (A)>

In the present invention, the component (A) includes at least one structural unit (a0) selected from the group consisting of a structural unit represented by general formula (a0-1) and a structural unit represented by general formula (a0-2).

In the present invention, it is preferable that the component (A) have a structural unit (a2) derived from an acrylate ester containing a lactone-containing cyclic group, as well as the structural unit (a0).

Further, in the present invention, it is preferable that the component (A) have a structural unit (a3) derived from an acrylate ester containing a polar group-containing aliphatic hydrocarbon group, as well as the structural unit (a0), or the structural unit (a0) and the structural unit (a2).

In the present descriptions and the claims, the expression "structural unit derived from an acrylate ester" refers to a structural unit that is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be used.

With respect to the "structural unit derived from an acrylate ester", the "α-position (the carbon atom on the α-position)" refers to the carbon atom having the carbonyl group bonded thereto, unless specified otherwise.

With respect to the acrylate ester, specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

In the present invention, it is preferable that a hydrogen atom, a lower alkyl group or a halogenated lower alkyl group is bonded to the α-position of the acrylate ester, a hydrogen atom, a lower alkyl group or a fluorinated lower alkyl group is more preferable, and in terms of industrial availability, a hydrogen atom or a methyl group is the most desirable.

Structural Unit (a0)

The structural unit (a0) is at least one structural unit selected from the group consisting of a structural unit represented by general formula (a0-1) shown below (hereafter, referred to as "structural unit (a0-1)") and a structural unit represented by general formula (a0-2) shown below (hereafter, referred to as "structural unit (a0-2)"). Hereinbelow, each of the structural units will be described in detail.

[Chemical Formula 3.]

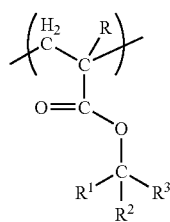

(a0-1)

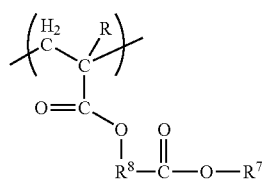

(a0-2)

In formula (a0-1), R represents a hydrogen atom, a lower alkyl group of 1 to 5 carbon atoms or a halogenated lower alkyl group of 1 to 5 carbon atoms; $R^1$ represents a branched alkyl group of 3 or more carbon atoms; and each of $R^2$ and $R^3$ independently represents an alkyl group, wherein $R^2$ and $R^3$ may be mutually bonded to form a polycyclic group. In general formula (a0-2), R represents a hydrogen atom, a lower alkyl group of 1 to 5 carbon atoms or a halogenated lower alkyl group of 1 to 5 carbon atoms; $R^8$ represents a divalent linking group that contains no halogen atom; and $R^7$ represents an acid dissociable, dissolution inhibiting group.

Structural Unit (a0-1)

In general formula (a0-1), R represents a hydrogen atom, a lower alkyl group of 1 to 5 carbon atoms or a halogenated lower alkyl group of 1 to 5 carbon atoms.

As the lower alkyl group for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated lower alkyl group for R is a group in which part or all of the hydrogen atoms of the aforementioned lower alkyl group is substituted with halogen atoms. Examples of halogen atoms include fluorine atoms, chlorine atoms, bromine atoms and iodine atoms, and fluorine atoms are particularly desirable.

As R, a hydrogen atom, a lower alkyl group or a fluorinated lower alkyl group is preferable, and in terms of industrial availability, a hydrogen atom or a methyl group is particularly desirable.

In general formula (a0-1), $R^1$ represents a branched alkyl group of 3 or more carbon atoms.

Examples of $R^1$ include branched alkyl groups of 3 to 10 carbon atoms, and branched alkyl groups of 3 to 5 carbon atoms is preferable. Specific examples of such branched alkyl groups include an isopropyl group, an isobutyl group, a tert-butyl group, an isopentyl group and a neopentyl group, and an isopropyl group is particularly desirable.

In general formula (a0-1), each of $R^2$ and $R^3$ independently represents an alkyl group, wherein $R^2$ and $R^3$ may be mutually bonded to form a polycyclic group.

As the alkyl group for $R^2$ and $R^3$, a linear, branched or cyclic group of 1 to 10 carbon atoms is preferable, and specific examples thereof include a methyl group, an ethyl group, a propyl group, an isopropyl group, an n-butyl group, an isobutyl group, a tert-butyl group, a pentyl group, an isopentyl group, a neopentyl group, a cyclopentyl group and a cyclohexyl group.

The cyclic group which is formed by the $R^2$ group and the $R^3$ group being mutually bonded may or may not have a substituent. Examples of substituents include a lower alkyl group of 1 to 5 carbon atoms, a fluorine atom, a fluorinated lower alkyl group of 1 to 5 carbon atoms, and an oxygen atom (=O).

The basic ring of the polycyclic group exclusive of substituents is not limited to being constituted from only carbon and hydrogen (not limited to hydrocarbon groups), but is preferably a hydrocarbon group. Further, the "hydrocarbon group" may be either saturated or unsaturated, but is preferably saturated.

As such polycyclic groups, groups in which two or more hydrogen atoms have been removed from a polycycloalkane such as a bicycloalkane, tricycloalkane or tetracycloalkane which may or may not be substituted with a lower alkyl group, a fluorine atom or a fluorinated lower alkyl group, may be used. Specific examples include groups in which two or more hydrogen atoms have been removed from a polycycloalkane such as adamantane, norbornane, isobornane, dicyclodecane, tricyclodecane or tetracyclododecane.

As the structural unit (a0-1) represented by general formula (a0-1), structural units represented by general formulas (a0-1) to (a0-1-4) shown below are preferable.

[Chemical Formula 4.]

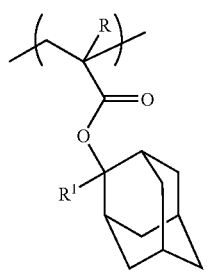

(a0-1-1)

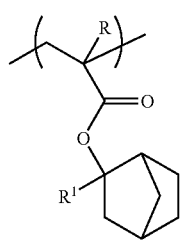

(a0-1-2)

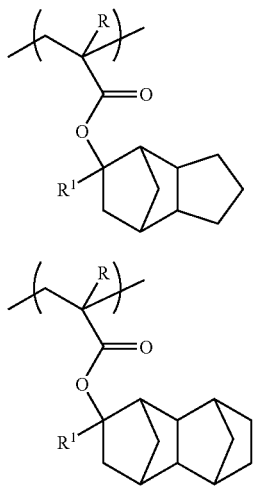

In the formula, R represents a hydrogen atom, a lower alkyl group of 1 to 5 carbon atoms or a halogenated lower alkyl group of 1 to 5 carbon atoms; and $R^1$ represents a branched alkyl group of 3 or more carbon atoms.

In general formulas (a0-1) to (a0-1-4), R is the same as defined above.

$R^1$ is the same as defined above, preferably a branched alkyl group of 3 to 5 carbon atoms, and most preferably an isopropyl group.

Structural Unit (a0-2)

In general formula (a0-2), R represents a hydrogen atom, a lower alkyl group of 1 to 5 carbon atoms or a halogenated lower alkyl group of 1 to 5 carbon atoms, and the same groups as those described above for R in general formula (a0-1) can be used.

In general formula (a0-2), $R^8$ represents a divalent linkage group. However, the divalent linkage group does not contain a halogen atom.

As examples of the divalent linking group for $R^8$, a divalent hydrocarbon group which may have a substituent, and a divalent group containing a hetero atom can be given.

A hydrocarbon "has a substituent" means that part or all of the hydrogen atoms within the hydrocarbon group is substituted with groups or atoms other than hydrogen atom.

The hydrocarbon group may be either an aliphatic hydrocarbon group or an aromatic hydrocarbon group.

An "aliphatic hydrocarbon group" refers to a hydrocarbon group that has no aromaticity.

The aliphatic hydrocarbon group for $R^8$ may be either saturated or unsaturated, but is preferably saturated.

As specific examples of the aliphatic hydrocarbon group, a linear or branched aliphatic hydrocarbon group (hereafter, referred to as "chain-like aliphatic hydrocarbon group"), and an aliphatic hydrocarbon group containing a ring in the structure thereof can be given.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As a branched aliphatic hydrocarbon group, a branched alkylene group is preferable, and specific examples include alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, and —$CH(CH_2CH_3)CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The chain-like aliphatic hydrocarbon group may or may not have a substituent.

As an example of a substituent, an oxygen atom can be given.

As examples of the hydrocarbon group containing a ring, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group.

As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent.

Examples of substituents include a lower alkyl group of 1 to 5 carbon atoms and an oxygen atom (=O).

With respect to a divalent group containing a hetero atom, a hetero atom is an atom other than carbon and hydrogen, and examples thereof include an oxygen atom, a nitrogen atom and a sulfur atom.

Examples of divalent groups containing a hetero atom include —O—, —C(=O)—, —C(=O)—O—, —NH—, —$NR^{04}$— (in the formula, $R^{04}$ represents an alkyl group), —NH—C(=O)—, =N—, and a combination of at least one of these groups with the aforementioned divalent hydrocarbon group.

As $R^8$, a divalent group containing a hetero atom is preferable, a linear group containing an oxygen atom as a hetero atom (e.g., an ether bond or an ester bond) is more preferable, and a combination of an ester bond with a linear alkylene group or a combination of an ether bond with a linear alkylene group is particularly desirable.

In general formula (a0-2), $R^7$ represents an acid dissociable, dissolution inhibiting group.

When the component (A) is blended with the component (B) for a positive resist composition, the acid dissociable, dissolution inhibiting group exhibits an acid dissociability so as to be dissociated by action of acid generated from the component (B) upon exposure, and an alkali dissolution-inhibiting effect that renders the entire component (A) insoluble in an alkali developing solution prior to dissociation.

As the acid dissociable, dissolution inhibiting group for $R^7$, any of those which have been proposed as acid dissociable, dissolution inhibiting groups for a base resin of a chemically amplified resist may be used. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

With respect to the aliphatic branched, acid dissociable, dissolution inhibiting group, "aliphatic branched" refers to a branched structure having no aromaticity.

The "aliphatic branched, acid dissociable, dissolution inhibiting group" is not limited to being constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable, dissolution inhibiting group, for example, a group represented by the formula —C($R^{71}$)($R^{72}$)($R^{73}$) can be given (in the formula, each of $R^{71}$ to $R^{73}$ independently represents a linear alkyl group of 1 to 5 carbon atoms). The group represented by the formula —C($R^{71}$)($R^{72}$)($R^{73}$) preferably has 4 to 8 carbon atoms, and specific examples include a tert-butyl group, a tert-pentyl group and a tert-heptyl group.

With respect to an aliphatic cyclic group-containing acid dissociable, dissolution inhibiting group, "aliphatic cyclic group" refers to a monocyclic group or polycyclic group that has no aromaticity.

The aliphatic cyclic group may or may not have a substituent.

Examples of substituents include lower alkyl groups of 1 to 5 carbon atoms, fluorine atom, fluorinated lower alkyl groups of 1 to 5 carbon atoms, and oxygen atom (=O).

The basic ring of the "aliphatic cyclic group" exclusive of substituents is not limited to being constituted from only carbon and hydrogen (not limited to hydrocarbon groups), but is preferably a hydrocarbon group.

Further, the "hydrocarbon group" may be either saturated or unsaturated, but is preferably saturated.

Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, dicyclodecane, tricyclodecane or tetracyclododecane.

Examples of aliphatic cyclic group-containing acid dissociable, dissolution inhibiting groups include (i) a group which has a tertiary carbon atom on the ring structure of a monovalent aliphatic cyclic group; and (ii) a group which has a branched alkylene group containing a tertiary carbon atom, and a monovalent aliphatic cyclic group to which the tertiary carbon atom is bonded.

Specific examples of (i) a group which has a tertiary carbon atom on the ring structure of a monovalent aliphatic cyclic group include groups represented by general formulas (1-1) to (1-9) shown below.

Specific examples of (ii) a group which has a branched alkylene group containing a tertiary carbon atom, and a monovalent aliphatic cyclic group to which the tertiary carbon atom is bonded include groups represented by general formulas (2-1) to (2-6) shown below.

[Chemical Formula 5.]

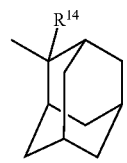
(1-1)

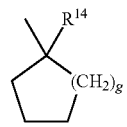
(1-2)

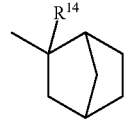
(1-3)

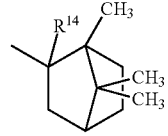
(1-4)

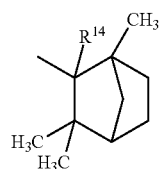
(1-5)

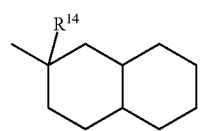
(1-6)

(1-7)

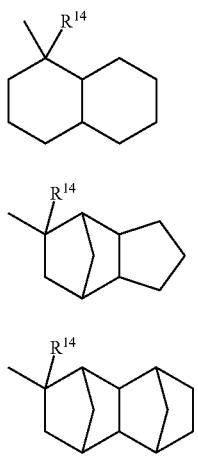

(1-8)

(1-9)

In the formulas above, $R^{14}$ represents a lower alkyl group; and g represents an integer of 0 to 8.

[Chemical Formula 6.]

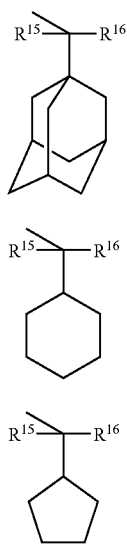

(2-1)

(2-2)

(2-3)

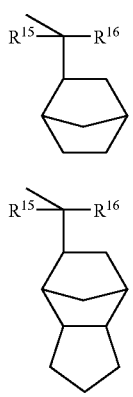

(2-4)

(2-5)

(2-6)

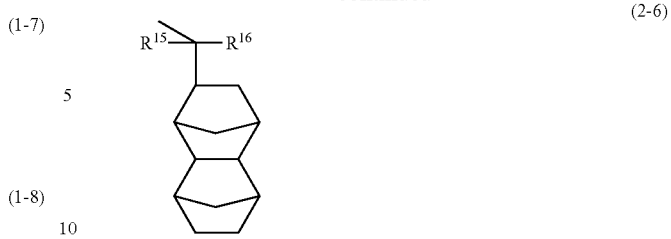

In the formulas above, each of $R^{15}$ and $R^{16}$ independently represents an alkyl group.

As the alkyl group for $R^{14}$ to $R^{16}$, a lower alkyl group is preferable, and a linear or branched alkyl group is more preferable. Specific examples include a methyl group, an ethyl group, a propyl group, an isopropyl group, an n-butyl group, an isobutyl group, a tert-butyl group, a pentyl group, an isopentyl group, and a neopentyl group. Among these, a methyl group, an ethyl group or an n-butyl group is preferable, and a methyl group or an ethyl group is more preferable.

g is preferably an integer of 0 to 3, more preferably 1 to 3, and still more preferably 1 or 2.

An "acetal-type acid dissociable, dissolution inhibiting group" for $R^7$ generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 7.]

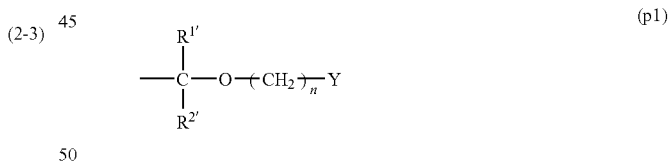

(p1)

In the formula, $R^{1'}$ and $R^{2'}$ each independently represent a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1'}$ and $R^{2'}$, the same lower alkyl groups as those described above for R can be used, although a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 8.]

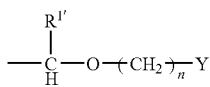
(p1-1)

In the formula, $R^{1'}$, n and Y are the same as defined above.

As the lower alkyl group for Y, the same as the lower alkyl groups for R above can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 9.]

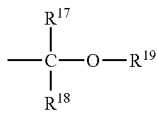
(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

Specific examples of acetal-type acid dissociable, dissolution inhibiting groups include groups represented by formulas (3-1) to (3-12) shown below.

[Chemical Formula 10.]

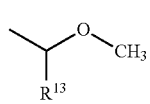
(3-1)

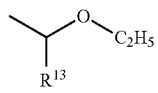
(3-2)

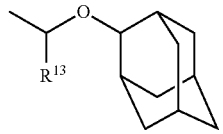
(3-3)

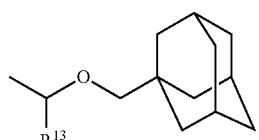
(3-4)

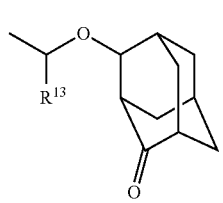
(3-5)

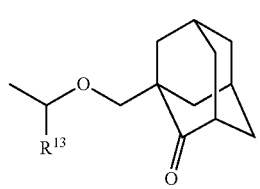
(3-6)

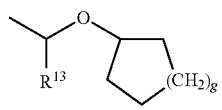
(3-7)

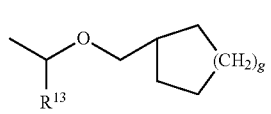
(3-8)

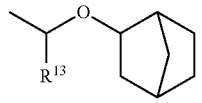
(3-9)

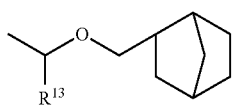
(3-10)

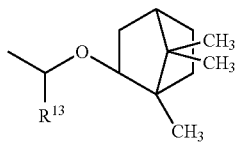
(3-11)

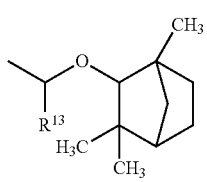
(3-12)

In the formulas above, $R^{13}$ represents a hydrogen atom or a methyl group; and g is the same as defined above.

In the present invention, $R^7$ is preferably a tertiary alkyl ester-type acid dissociable, dissolution inhibiting group, more preferably the aforementioned group (i) which has a tertiary carbon atom on the ring structure of a monovalent aliphatic cyclic group. Among the aforementioned groups (i), a group represented by general formula (1-1) above is particularly desirable.

As a preferable example of the structural unit (a0-2) represented by general formula (a0-2), a structural unit represented by general formula (a0-2-0) shown below can be given.

[Chemical Formula 11.]

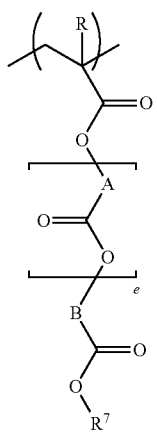
(a0-2-0)

In general formula (a0-2-0), R represents a hydrogen atom, a lower alkyl group of 1 to 5 carbon atoms or a halogenated lower alkyl group of 1 to 5 carbon atoms; each of A and B independently represents a divalent linking group containing no halogen atom; $R^7$ represents an acid dissociable, dissolution inhibiting group: and e represents an integer of 0 to 3.

In general formula (a0-2-0), R represents a hydrogen atom, a lower alkyl group of 1 to 5 carbon atoms or a halogenated lower alkyl group of 1 to 5 carbon atoms, and is the same as defined for R in general formula (a0-2).

As examples of the divalent linking group for A which does not contain a halogen atom, the same groups as those described above for $R^8$ in general formula (a0-2) can be given.

As A, a divalent hydrocarbon group which may have a substituent is preferable, more preferably a linear aliphatic hydrocarbon group, and still more preferably a linear alkylene group. Among these, a linear alkylene group of 1 to 5 carbon atoms is preferable, and a methylene group or an ethylene group is particularly desirable.

As examples of the divalent linking group for B which does not contain a halogen atom, the same groups as those described above for A can be given.

When B is a divalent hydrocarbon group which may have a substituent, a linear aliphatic hydrocarbon group is more preferable, and a linear alkylene group is still more preferable. Among these, a linear alkylene group of 1 to 5 carbon atoms is preferable, and a methylene group or an ethylene group is particularly desirable.

When B is a divalent linking group containing a hetero atom, a combination of an ether bond with an alkylene group is preferable, and —$(CH_2)_2$—O—$CH_2$— is particularly desirable.

$R^7$ represents an acid dissociable, dissolution inhibiting group, and is the same as defined for $R^7$ in general formula (a0-2).

$R^7$ is preferably a tertiary alkyl ester-type acid dissociable, dissolution inhibiting group, more preferably the aforementioned group (i) which has a tertiary carbon atom on the ring structure of a monovalent aliphatic cyclic group. Among the aforementioned groups (i), a group represented by general formula (1-1) above is preferable.

e represents an integer of 0 to 3, preferably an integer of 0 to 2, and most preferably 0 or 1.

As the structural unit represented by general formula (a0-2-0), a structural unit represented by any one of general formulas (a0-2-1) to (a0-2-3) shown below is preferable.

[Chemical Formula 12.]

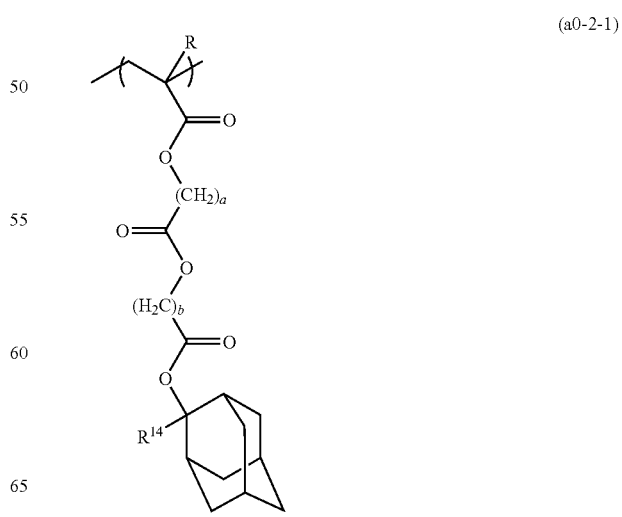
(a0-2-1)

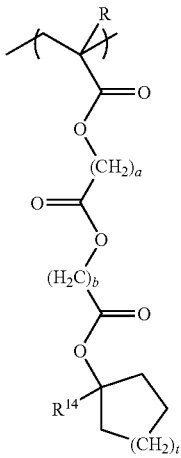
(a0-2-2)

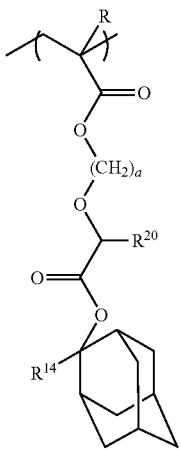
(a0-2-3)

In the formulas, R and $R^{14}$ are the same as defined above; $R^{20}$ represents a hydrogen atom or a methyl group; a represents an integer of 1 to 10; b represents an integer of 1 to 10; and t represents an integer of 0 to 3.

a is preferably an integer of 1 to 5, and most preferably 1 or 2.

b is preferably an integer of 1 to 5, and most preferably 1 or 2.

t is preferably an integer of 1 to 3, and most preferably 1 or 2.

As described above, the structural unit (a0) is at least one structural unit selected from the group consisting of the aforementioned structural unit (a0-1) and the aforementioned structural unit (a0-2). As each of the structural unit (a0-1) and the structural unit (a0-2), one type of structural unit may be used, or two or more types may be used in combination.

In the component (A), the amount of the structural unit (a0) based on the combined total of all structural units constituting the component (A) is preferably 20 to 80 mol %, more preferably 25 to 70 mol %, and most preferably 30 to 65 mol %.

In the component (A), the amount of the structural unit (a0-1) based on the combined total of all structural units constituting the component (A) is preferably 5 to 70 mol %, more preferably 10 to 65 mol %, and most preferably 15 to 60 mol %.

In the component (A), the amount of the structural unit (a0-2) based on the combined total of all structural units constituting the component (A) is preferably 5 to 50 mol %, more preferably 5 to 40 mol %, and most preferably 10 to 35 mol %.

By ensuring that the amounts of the above-mentioned structural units are at least as large as the lower limit of the above-mentioned ranges, a pattern can be easily formed using a positive resist composition prepared from the component (A). On the other hand, by ensuring that the amounts of the structural units are no more than the upper limit of the above-mentioned ranges, a good balance can be achieved with the other structural units.

Especially, in consideration of improvement in various lithography properties (e.g., resolution, pattern shape and line edge roughness (LER)) and dissolution contrast of the positive resist composition containing the component (A), the amount of each of the structural unit (a0-1) and the structural unit (a0-2) based on the combined total of all structural units constituting the component (A) is preferably 5 mol % or more, and more preferably 10 mol % or more.

"LER" refers to the unevenness (roughness) of the side walls of a resist pattern. LER can cause distortions around the holes in a hole pattern, and fluctuations in the line width in line and space patterns, and consequently has the potential to adversely affect the formation of very fine semiconductor elements, and improvement of LER has been desired in the art.

Structural Unit (a2)

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 13.]

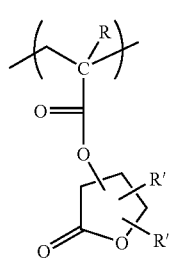
(a2-1)

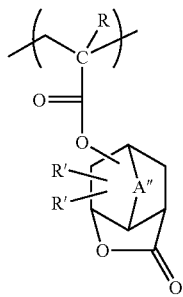
(a2-2)

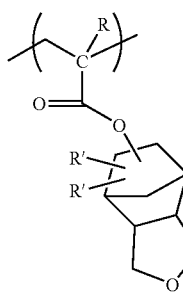
(a2-3)

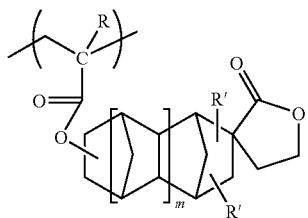
(a2-4)

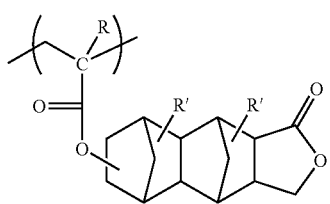
(a2-5)

In the formulas above, R represents a hydrogen atom, a lower alkyl group or a halogenated lower alkyl group; R' represents a hydrogen atom, a lower alkyl group, an alkoxy group of 1 to 5 carbon atoms or —COOR" (wherein R" represents a hydrogen atom or a linear, branched or cyclic alkyl group of 1 to 15 carbon atoms); m represents 0 or 1; and A" represents an alkylene group of 1 to 5 carbon atoms or an oxygen atom.

In general formulas (a2-1) to (a2-5), R is the same as defined for R in the structural unit (a0-1).

The lower alkyl group for R' is the same as defined above for the lower alkyl group for R. In the structural units represented by general formulas (a2-1) to (a2-5), in consideration of industrial availability, R' is preferably a hydrogen atom.

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

Specific examples of alkylene groups of 1 to 5 carbon atoms for A" include a methylene group, ethylene group, n-propylene group and isopropylene group.

In general formula (a2-1), the bonding position of the oxygen atom (—O—) on the γ-butyrolactone ring is not particularly limited, but is preferably the α-position or the β-position.

Specific examples of structural units represented by general formulas (a2-1) to (a2-5) are shown below.

[Chemical Formula 14.]

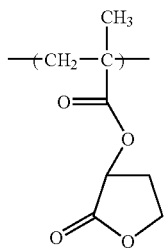
(a2-1-1)

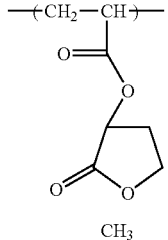
(a2-1-2)

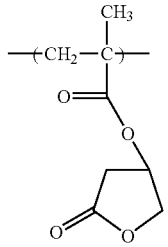
(a2-1-3)

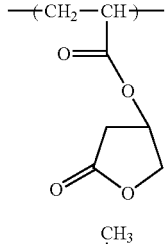
(a2-1-4)

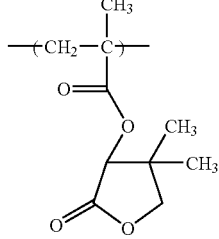
(a2-1-5)

(a2-1-6)
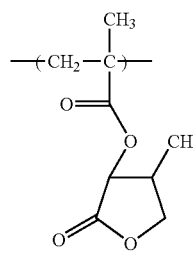
[Chemical Formula 15.]
(a2-2-1)
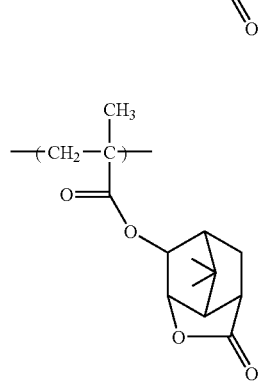
(a2-2-2)
(a2-2-3)
(a2-2-4)
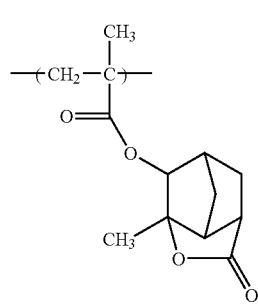
(a2-2-5)
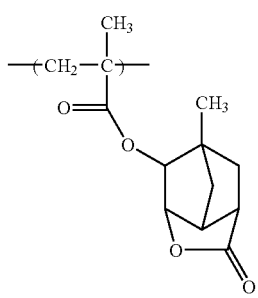
(a2-2-6)
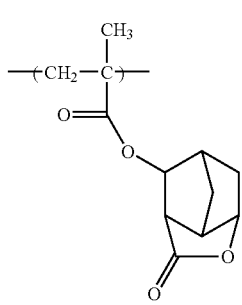
(a2-2-7)
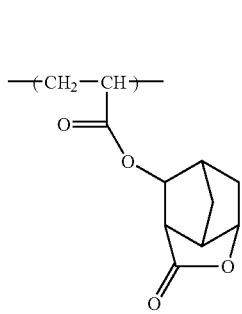
(a2-2-8)
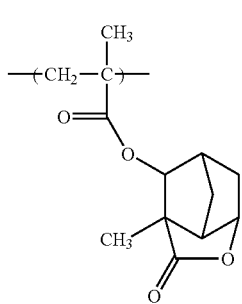
(a2-2-9)
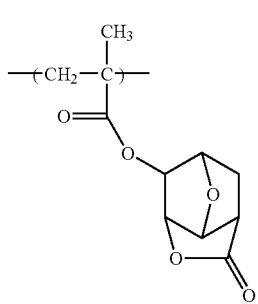

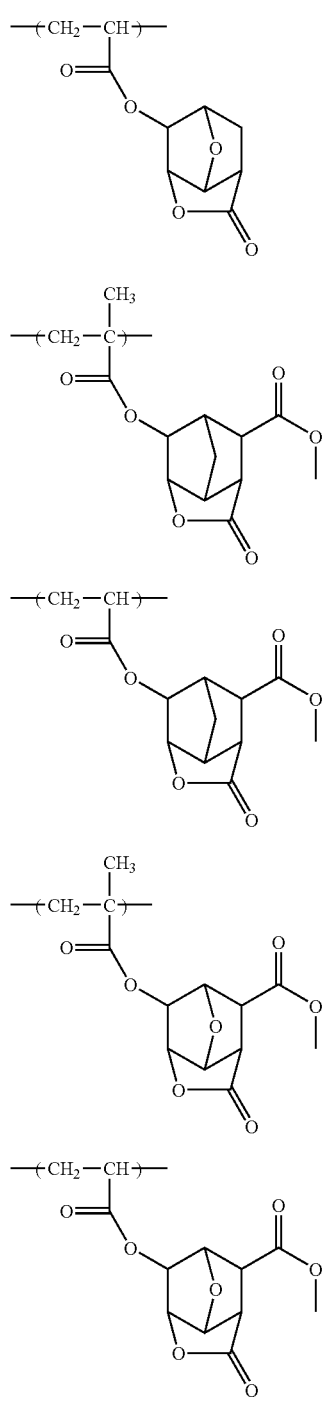
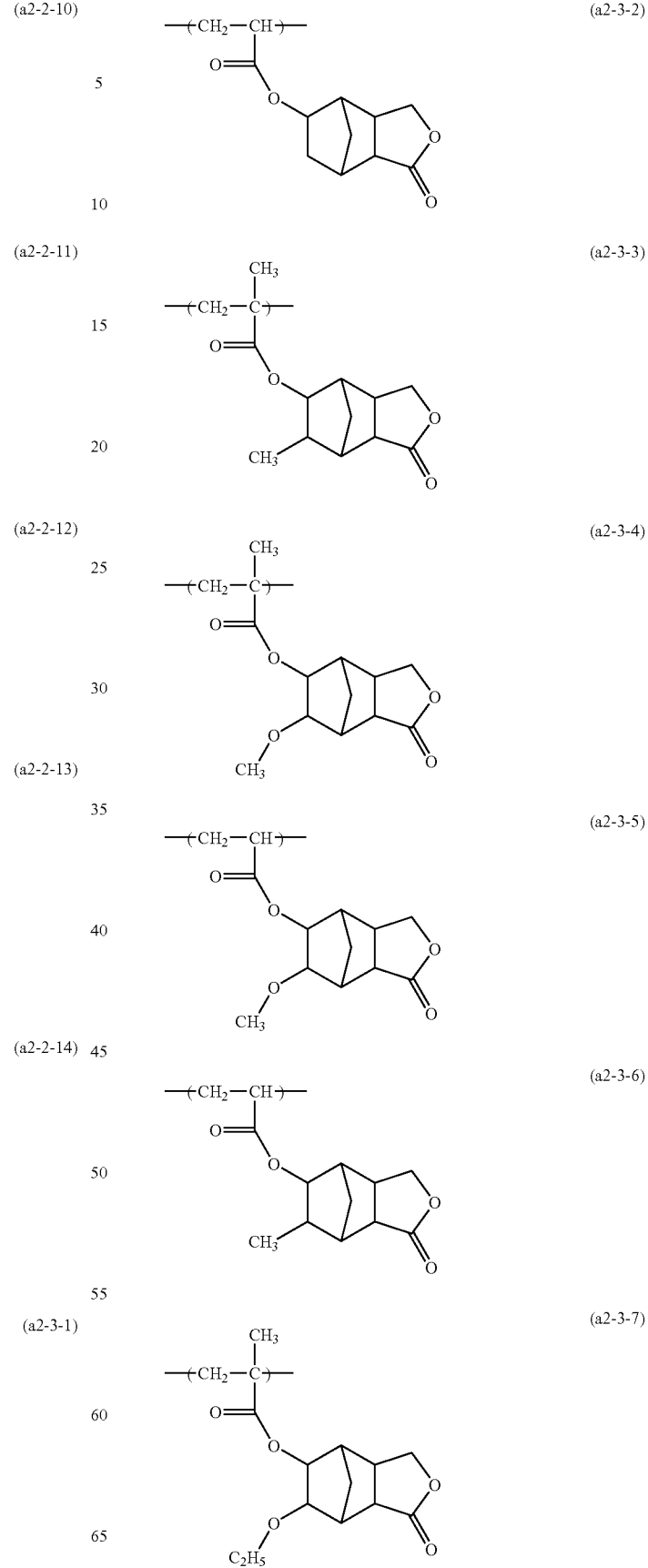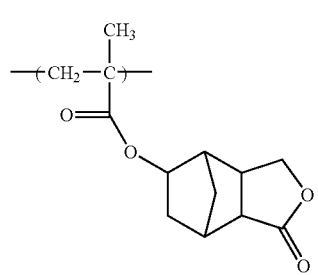
[Chemical Formula 16.]

-continued
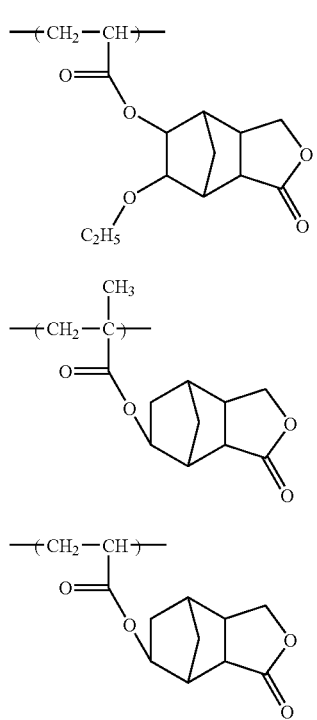
[Chemical Formula 17.]
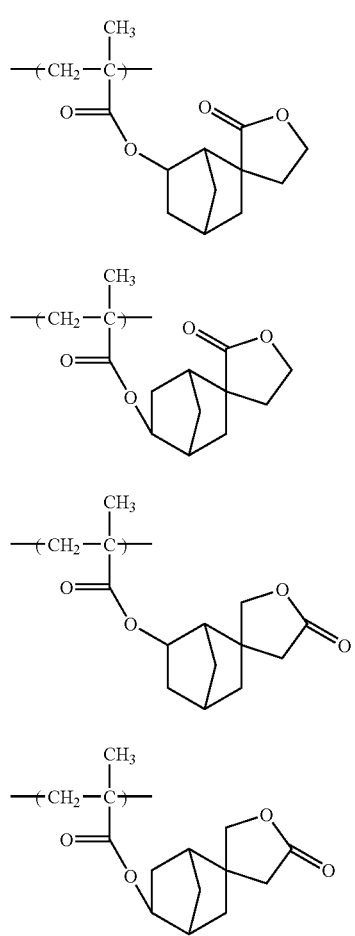
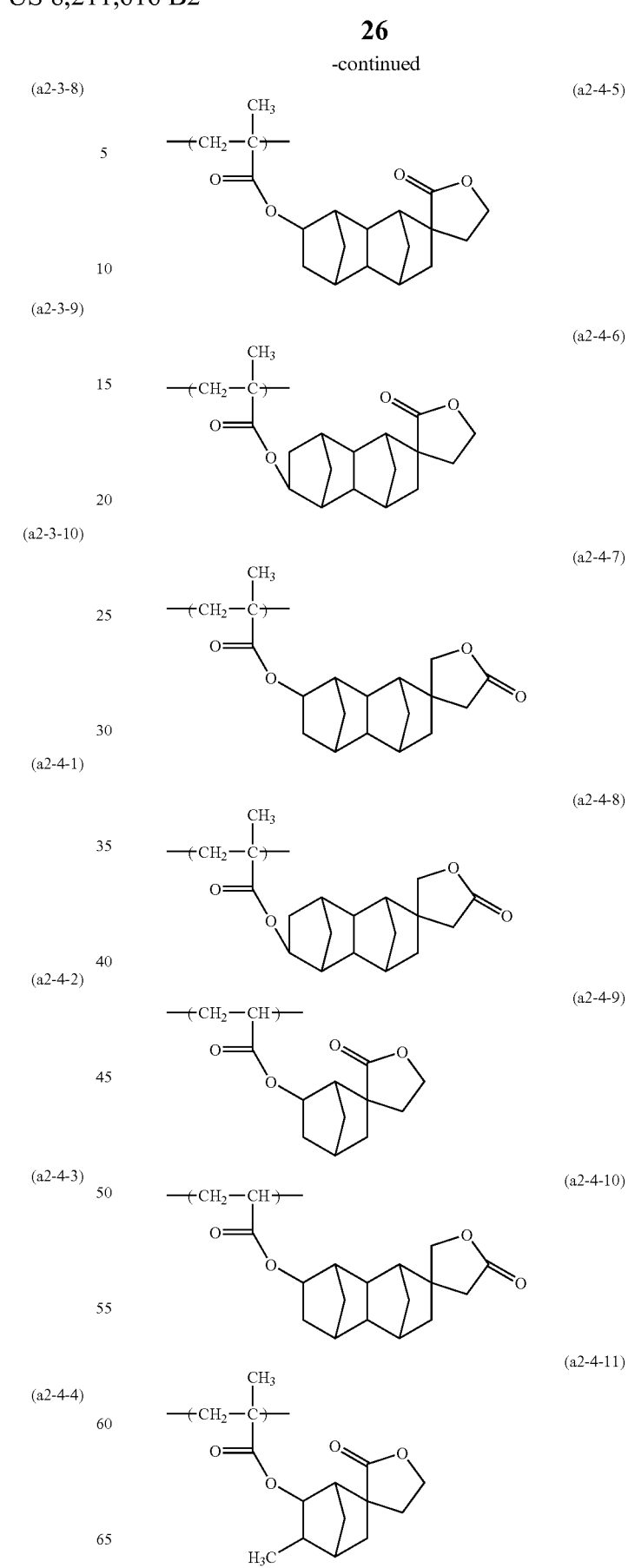

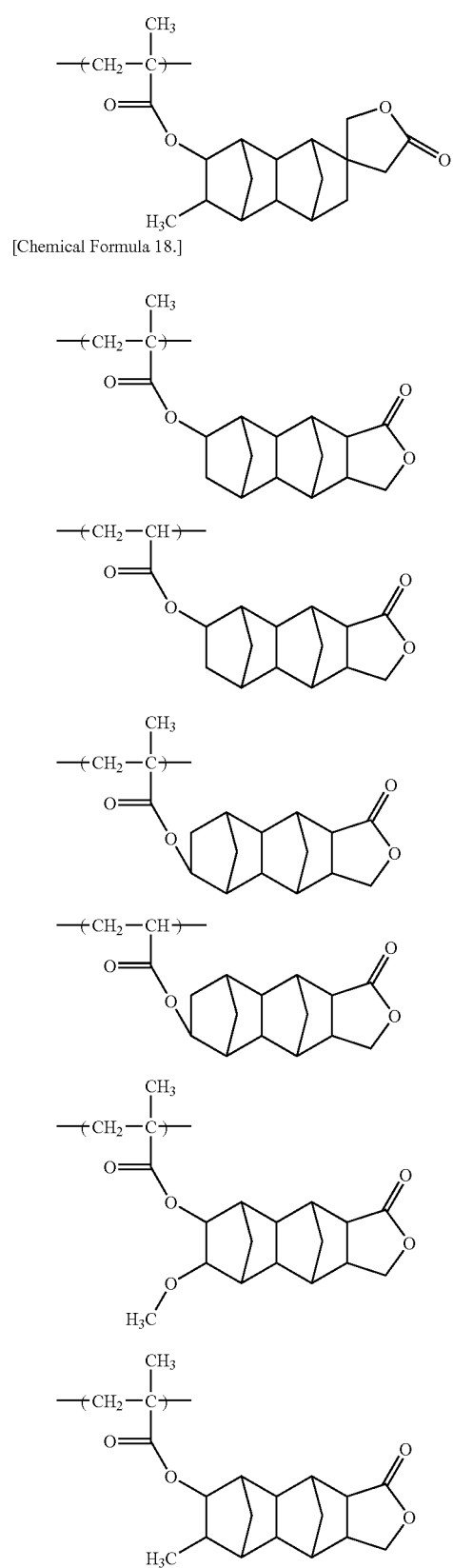

As the structural unit (a2), at least one structural unit selected from the group consisting of formulas (a2-1) to (a2-5) is preferable, and at least one structural unit selected from the group consisting of formulas (a2-1) to (a2-3) is more preferable. Specifically, it is preferable to use at least one structural unit selected from the group consisting of formulas (a2-1-1), (a2-1-2), (a2-1-3), (a2-1-4), (a2-2-1), (a2-2-2), (a2-3-1), (a2-3-2), (a2-3-9) and (a2-3-10).

As the structural unit (a2), one type of structural unit may be used, or two or more types may be used in combination.

In the component (A), the amount of the structural unit (a2) based on the combined total of all structural units constituting the component (A) is preferably 5 to 60 mol %, more preferably 10 to 55 mol %, and still more preferably 20 to 55 mol %. By ensuring that the amount of the structural unit (a2) is at least as large as the lower limit of the above-mentioned range, the effect of using the structural unit (a2) can be satisfactorily achieved. On the other hand, by ensuring that the amount of the structural unit (a2) is no more than the upper limit of the above-mentioned range, a good balance can be achieved with the other structural units.

Structural Unit (a3)

The structural unit (a3) is a structural unit derived from an acrylate ester containing a polar group-containing aliphatic hydrocarbon group.

When the component (A) includes the structural unit (a3), the hydrophilicity of the component (A) is improved, and hence, the compatibility of the component (A) with an alkali developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups).

These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2), (a3-3) and (a3-4) shown below are preferable.

[Chemical Formula 19.]

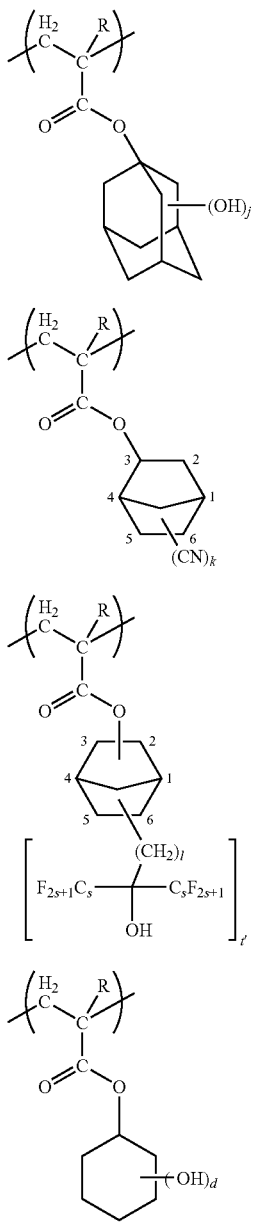

In the formulas above, R is as defined above; j is an integer of 1 to 3; k is an integer of 1 to 3; t' is an integer of 1 to 3; l is an integer of 1 to 5; s is an integer of 1 to 3; and d represents an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s preferably 1. Further, in formula (a3-3), it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

In formula (a3-4), d is preferably 1 or 2, and more preferably 1. Although the bonding position of the hydroxyl group is not particularly limited, when d is 1, the 2nd position is preferable in terms of availability and low cost. When d is 2 or 3, a desired combination of the bonding positions can be used.

As the structural unit (a3), one type of structural unit may be used, or two or more types may be used in combination.

In the component (A), the amount of the structural unit (a3) based on the combined total of all structural units constituting the component (A) is preferably 5 to 50 mol %, more preferably 5 to 40 mol %, and still more preferably 5 to 25 mol %. By ensuring that the amount of the structural unit (a3) is at least as large as the lower limit of the above-mentioned range, the effect of using the structural unit (a3) can be satisfactorily achieved. On the other hand, by ensuring that the amount of the structural unit (a3) is no more than the upper limit of the above-mentioned range, a good balance can be achieved with the other structural units.

Other Structural Units

The component (A) may also have a structural unit other than the above-mentioned structural units (a0), (a2) and (a3), as long as the effects of the present invention are not impaired.

As such a structural unit, a structural unit (a1) derived from an acrylate ester containing an acid dissociable, dissolution inhibiting group other than the structural unit (a0-1) and the structural unit (a0-2) can be used.

Preferable examples of the structural unit (a1) include structural units represented by general formula (a1-1-01) or (a1-1-02) shown below.

[Chemical Formula 20.]

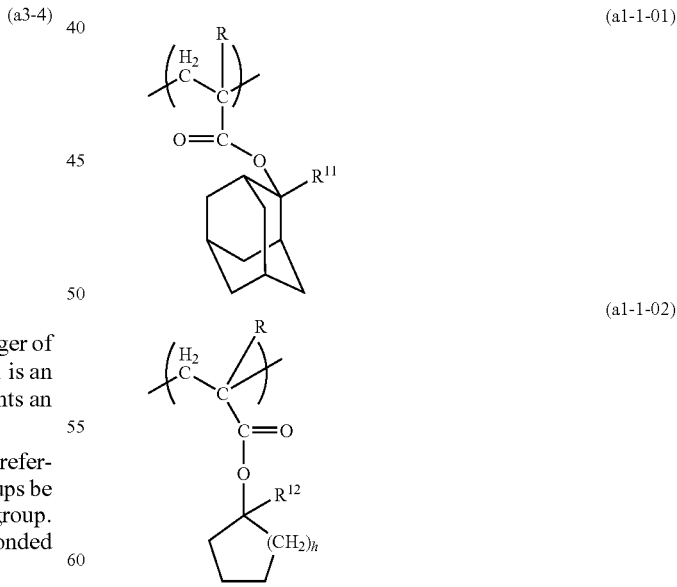

In general formula (a1-1-01), R represents a hydrogen atom, a lower alkyl group or a halogenated lower alkyl group; and $R^{11}$ represents a lower alkyl group. In general formula (a1-1-02), R is the same as defined above; $R^{12}$ represents a lower alkyl group; and h represents an integer of 1 to 3.

In general formula (a1-1-01), R is the same as defined above. The lower alkyl group for $R^{11}$ is the same as the lower alkyl group for R, and is preferably a methyl group or an ethyl group.

In general formula (a1-1-02), R is the same as defined above. The lower alkyl group for $R^{12}$ is the same as the lower alkyl group for R above, preferably a methyl group or an ethyl group, and most preferably an ethyl group. h is preferably 1 or 2, and most preferably 2.

As the structural unit (a1), one type of structural unit may be used alone, or two or more types of structural units may be used in combination.

In the component (A), the amount of structural unit (a1) based on the combined total of all structural units constituting the component (A) is preferably 10 mol % or less, more preferably 5 mol % or less, and it is particularly desirable that the component (A) contains no structural unit (a1).

The component (A) may also have a structural unit (a4) other than the above-mentioned structural units (a0), (a1), (a2) and (a3), as long as the effects of the present invention are not impaired.

As the structural unit (a4), any other structural unit which cannot be classified as one of the above structural units (a0) and (a1) to (a3) can be used without any particular limitation, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in connection with the aforementioned structural unit (a0-1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 21.]

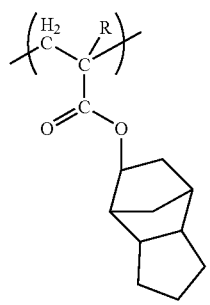
(a4-1)

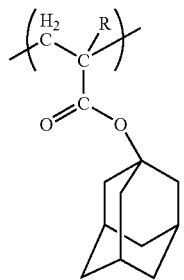
(a4-2)

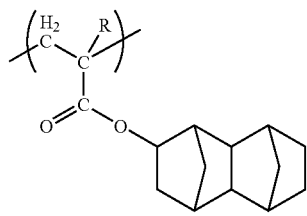
(a4-3)

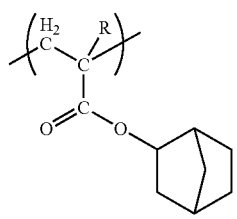
(a4-4)

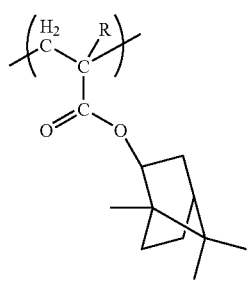
(a4-5)

In the formula, R is the same as defined above.

When the structural unit (a4) is included in the component (A), the amount of the structural unit (a4) based on the combined total of all the structural units that constitute the component (A) is preferably within the range from 1 to 30 mol %, and more preferably from 10 to 20 mol %.

In the present invention, the component (A) is a polymer that includes at least one structural unit (a0) selected from the group consisting of the structural unit (a0-1) and the structural unit (a0-2).

As such a polymer, a polymer having a structural unit (a0-2) (hereafter, this polymer is referred to as "polymeric compound (A0)") and a copolymer having the structural unit (a0-1) and the structural unit (a0-2) (hereafter, this copolymer is referred to as "polymeric compound (A1)") can be given as preferable examples.

Examples of the polymeric compound (A0) include a polymer consisting of a structural unit (a0-2); a copolymer consisting of a structural unit (a0-2) and a structural unit (a2); a copolymer consisting of a structural unit (a0-2) and a structural unit (a3); a copolymer consisting of a structural unit (a0-2), a structural unit (a2) and a structural unit (a3); a copolymer consisting of a structural unit (a0-2), a structural unit (a2), a structural unit (a3) and a structural unit (a4); and a copolymer consisting of a structural unit (a0-2), a structural unit (a2), a structural unit (a3) and a structural unit (a1).

Examples of the polymeric compound (A1) include a copolymer consisting of a structural unit (a0-1) and a structural unit (a0-2); a copolymer consisting of a structural unit (a0-1), a structural unit (a0-2) and a structural unit (a2); a copolymer consisting of a structural unit (a0-1), a structural unit (a0-2) and a structural unit (a3); a copolymer consisting of a structural unit (a0-1), a structural unit (a0-2), a structural unit (a2) and a structural unit (a3); a copolymer consisting of a structural unit (a0-1), a structural unit (a0-2), a structural unit (a2), a structural unit (a3) and a structural unit (a4); and a copolymer consisting of a structural unit (a0-1), a structural unit (a0-2), a structural unit (a2), a structural unit (a3) and a structural unit (a1).

In the present invention, as the polymeric compound (A0), a polymer that includes a combination of structural units such as that represented by formula (A0-11) shown below is particularly desirable.

[Chemical Formula 22.]

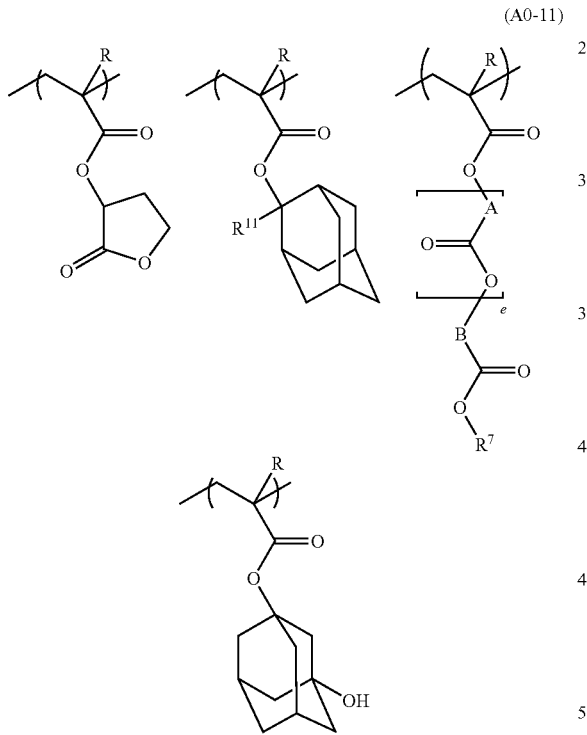

(A0-11)

In the formulas, R, $R^7$, $R^{11}$, A, B and e are the same as defined above; and the plurality of R may be the same or different from each other.

In formula (A0-11), R is the same as defined above.

$R^{11}$ is the same as defined above, preferably a linear alkyl group of 1 to 3 carbon atoms, and most preferably an ethyl group.

A is the same as defined above, and is most preferably a methylene group or an ethylene group.

B is the same as defined above, and is most preferably a methylene group, an ethylene group or —$(CH_2)_2$—O—$CH_2$—.

$R^7$ is the same as defined above, preferably a tertiary alkyl ester-type acid dissociable, dissolution inhibiting group, more preferably the aforementioned group (i) which has a tertiary carbon atom on the ring structure of a monovalent aliphatic cyclic group. Among the aforementioned groups (i), a group represented by general formula (1-1) above is preferable.

e is the same as defined above, and is most preferably 0 or 1.

In the present invention, as the polymeric compound (A1), a polymer that includes a combination of structural units such as that represented by formula (A1-11) shown below is particularly desirable.

[Chemical Formula 23.]

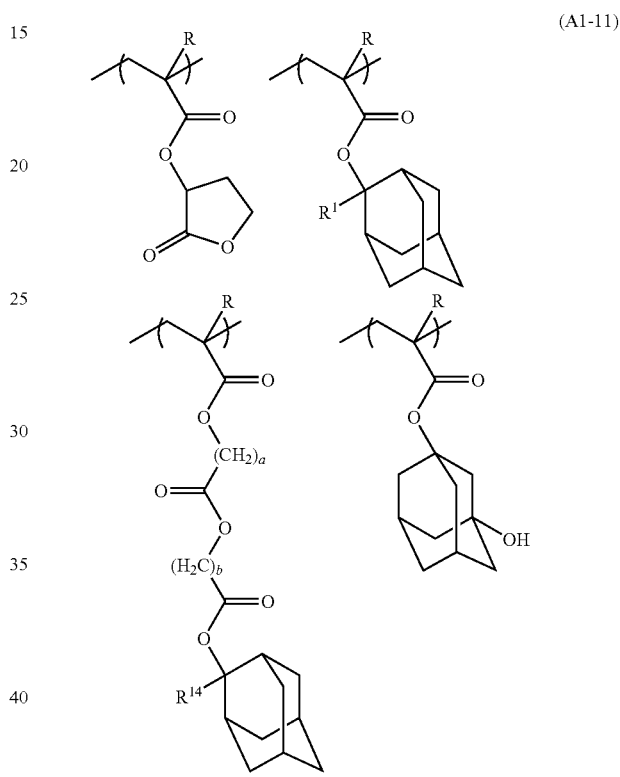

(A1-11)

In the formula, R, $R^1$, $R^{14}$, a and b are the same as defined above; and the plurality of R may be the same or different from each other.

In formula (A1-11), R is the same as defined above.

$R^1$ is the same as defined above, preferably a branched alkyl group of 3 to 5 carbon atoms, and most preferably an isopropyl group.

$R^{14}$ is preferably a linear or branched alkyl group, more preferably a methyl group, an ethyl group or an n-butyl group, and most preferably a methyl group or an ethyl group.

a is preferably an integer of 1 to 5, and most preferably 1 or 2.

b is preferably an integer of 1 to 5, and most preferably 1 or 2.

The polymeric compound (A1) can be obtained, for example, by a conventional radical polymerization or the like of monomers for deriving the objective structural units (e.g., the compounds 1 to 6 described later and, if desired, monomers corresponding with other structural units), using a radical polymerization initiator such as azobisisobutyronitrile (AIBN) or dimethyl-2,2'-azobis(2-methylpropionate) (product name: V-601; manufactured by Wako Pure Chemical Industries, Ltd.).

Furthermore, in the polymeric compound (A1), by using a chain transfer agent such as HS—$CH_2$—$CH_2$—$CH_2$—C($CF_3$)$_2$—OH, a —C($CF_3$)$_2$—OH group can be introduced at the terminals of the main chain of the component (A1). Such a copolymer in which a hydroxyalkyl group in which some of the hydrogen atoms of the alkyl group are substituted with fluorine atoms has been introduced at the terminals of the main chain is effective in reducing developing defects and line edge roughness (LER).

The weight average molecular weight (Mw) (the polystyrene equivalent value determined by gel permeation chromatography) of the polymeric compound (A1) is not particularly limited, but is preferably 2,000 to 50,000, more preferably 3,000 to 30,000, and most preferably 5,000 to 20,000. By ensuring that the weight average molecular weight is no more than the upper limit of the above-mentioned range, the resist composition exhibits a satisfactory solubility in a resist solvent. On the other hand, by ensuring that the weight average molecular weight is at least as large as the lower limit of the above-mentioned range, dry etching resistance and the cross-sectional shape of the resist pattern becomes satisfactory.

Further, the dispersity (Mw/Mn) of the polymeric compound (A1) is preferably 1.0 to 5.0, more preferably 1.0 to 3.0, and most preferably 1.2 to 2.5. Here, Mn is the number average molecular weight.

In the component (A), as the polymeric compound (A1), one type of compound may be used alone, or two or more types of compounds may be used in combination.

In the component (A), the amount of the polymeric compound (A1) based on the total weight of the component (A) is preferably 50 to 100% by weight, more preferably 80 to 100% by weight, and may even be 100% by weight.

The component (A) may contain "a resin component which exhibits increased solubility in an alkali developing solution under action of acid" other than the polymeric compound (A1) (hereafter, referred to as "component (A2)"), as long as the effects of the present invention are not impaired.

The component (A2) is not particularly limited, and any of the multitude of conventional resin components used within chemically amplified resist compositions (e.g., base resins used within chemically amplified resist compositions for ArF excimer lasers or KrF excimer lasers, preferably ArF excimer lasers) can be used. For example, as a base resin for ArF excimer laser, a base resin having the aforementioned structural unit (a1) as an essential component, and optionally the aforementioned structural units (a2) to (a4) can be used.

As the component (A2), one type of resin may be used, or two or more types of resins may be used in combination.

In the positive resist composition of the present invention, the amount of the component (A) can be appropriately adjusted depending on the thickness of the resist film to be formed, and the like.

<Component (B)>

In the present invention, the component (B) includes an acid generator (B1) consisting of a compound represented by general formula (b1) shown below (hereafter, this acid generator (B1) is referred to as "component (B1)").

[Chemical Formula 24.]

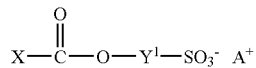

(b1)

In formula (b1), $Y^1$ represents a fluorinated alkylene group of 1 to 4 carbon atoms which may have a substituent; X represents an aliphatic cyclic group of 3 to 30 carbon atoms which may have a substituent; and $A^+$ represents an organic cation.

In general formula (b1), $Y^1$ represents a fluorinated alkylene group of 1 to 4 carbon atoms which may have a substituent.

As the fluorinated alkylene group for $Y^1$, the aforementioned alkylene group in which part or all of the hydrogen atoms has been substituted with fluorine atoms can be used.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

As $Y^1$, a fluorinated alkylene group in which the carbon atom bonded to the adjacent sulfur atom is fluorinated is particularly desirable. When a carbon atom bonded to the sulfur atom adjacent to $Y^1$ is fluorinated, an acid having a strong acidity is generated from the component (B) upon exposure. As a result, a resist pattern with an excellent shape can be formed, and various lithography properties can be improved.

Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Among these, —$CF_2$—, —$CF_2CF_2$—, —$CF_2CF_2CF_2$—, —$CH_2CF_2$— or $CH_2CF_2CF_2$— is preferable, —$CF_2$—, —$CF_2CF_2$—, —$CF_2CF_2CF_2$— or —$CH_2CF_2$— is more preferable, and —$CH_2CF_2$— is particularly desirable.

The fluorinated alkyl group for $Y^1$ may have a substituent.

When the fluorinated alkylene group "has a substituent", it means that part or all of the hydrogen atoms and/or fluorine atoms within the fluorinated alkylene group has been substituted with atoms or groups other than a hydrogen atom or a fluorine atom.

Examples of substituents which the fluorinated alkylene group may have include an alkyl group of 1 to 4 carbon atoms, an alkoxy group of 1 to 4 carbon atoms and a hydroxyl group.

In general formula (b1), X represents an aliphatic cyclic group of 3 to 30 carbon atoms which may have a substituent.

In the aliphatic cyclic group for X, part of the carbon atoms constituting the aliphatic cyclic group may be substituted with a substituent group containing a hetero atom, or part or all of the hydrogen atoms constituting the aliphatic cyclic group may be substituted with a substituent group containing a hetero atom.

As the "hetero atom" for X, there is no particular limitation as long as it is an atom other than a carbon atom and a hydrogen atom. Examples of hetero atoms include a halogen atom, an oxygen atom, a sulfur atom and a nitrogen atom.

Examples of halogen atoms include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. These substituents may be contained in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The aliphatic cyclic group may be either a monocyclic group or a polycyclic group. The aliphatic cyclic group has 3 to 30 carbon atoms, preferably 5 to 30, more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

In the present invention, as the aliphatic cyclic group for X which may have a substituent, an aliphatic polycyclic group which may have a substituent is preferable.

As the aliphatic polycyclic group, a group in which one or more hydrogen atoms have been removed from the aforementioned polycycloalkane is preferable.

In general formula (b1), A$^+$ represents an organic cation.

As the organic cation for A$^+$, there is no particular limitation, and any of those conventionally known as cation moiety for an onium salt acid generator can be appropriately selected for use.

As the cation moiety, a sulfonium ion or an iodonium ion is preferable, and a sulfonium ion is particularly desirable.

Specific examples include cations represented by general formula (I-1) or (I-2) shown below.

[Chemical Formula 25.]

(I-1)

(I-2)

In formula (I-1), each of $R^{1\prime\prime}$ to $R^{3\prime\prime}$ independently represents an aryl group which may have a substituent or an alkyl group which may have a substituent, with the provision that at least one of $R^{1\prime\prime}$ to $R^{3\prime\prime}$ represents an aryl group, and two of $R^{1\prime\prime}$ to $R^{3\prime\prime}$ in formula (I-1) may be bonded to each other to form a ring with the sulfur atom. In formula (I-2), $R^{5\prime\prime}$, and $R^{6\prime\prime}$ each independently represent an aryl group which may have a substituent or an alkyl group which may have a substituent, with the provision that and at least one of $R^5$, and $R^{6\prime\prime}$ represents an aryl group.

In formula (I-1), each of $R^{1\prime\prime}$ to $R^{3\prime\prime}$ independently represents an aryl group or an alkyl group. In formula (I-1), two of $R^{1\prime\prime}$ to $R^{3\prime\prime}$ may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. Examples thereof include an unsubstituted aryl group having 6 to 20 carbon atoms, a substituted aryl group in which part or all of the hydrogen atoms of the aforementioned unsubstituted aryl group has been substituted with alkyl groups, alkoxy groups, alkoxyalkyloxy groups, alkoxycarbonylalkyloxy groups, halogen atoms or hydroxyl groups, and a group represented by the formula —($R^{4t}$)—C(=O)—$R^{5t}$. $R^{4t}$ represents an alkylene group of 1 to 5 carbon atoms. $R^{5t}$ represents an aryl group. As the aryl group for $R^{5t}$, the same aryl groups as those described above for $R^{1\prime\prime}$ to $R^{3\prime\prime}$ can be used.

The unsubstituted aryl group is preferably an aryl group having 6 to 10 carbon atoms because it can be synthesized at a low cost. Specific examples thereof include a phenyl group and a naphthyl group.

The alkyl group as the substituent for the substituted aryl group is preferably an alkyl group having 1 to 5 carbon atoms, and a methyl group, an ethyl group, a propyl group, an n-butyl group, or a tert-butyl group is particularly desirable.

The alkoxy group as the substituent for the substituted aryl group is preferably an alkoxy group having 1 to 5 carbon atoms, and a methoxy group, an ethoxy group, an n-propoxy group, an iso-propoxy group, an n-butoxy group or a tert-butoxy group is particularly desirable.

The halogen atom as the substituent for the substituted aryl group is preferably a fluorine atom.

Examples of alkoxyalkyloxy groups as the substituent for the substituted aryl group include groups represented by a general formula shown below:

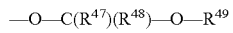

—O—C($R^{47}$)($R^{48}$)—O—$R^{49}$

In the formula, $R^{47}$ and $R^{48}$ each independently represents a hydrogen atom or a linear or branched alkyl group; and $R^{49}$ represents an alkyl group.

The alkyl group for $R^{47}$ and $R^{48}$ preferably has 1 to 5 carbon atoms, and may be either linear or branched. As the alkyl group, an ethyl group or a methyl group is preferable, and a methyl group is most preferable.

It is preferable that at least one of $R^{47}$ and $R^{48}$ be a hydrogen atom. It is particularly desirable that at least one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10.

Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

An example of the alkoxycarbonylalkyloxy group as the substituent for the substituted aryl group includes a group represented by a general formula —O—$R^{50}$—C(=O)—O—$R^{51}$ (in the formula, $R^{50}$ represents a linear or branched alkylene group; and $R^{51}$ represents a tertiary alkyl group).

The linear or branched alkylene group for $R^{50}$ preferably has 1 to 5 carbon atoms, and examples thereof include a methylene group, an ethylene group, a trimethylene group, a tetramethylene group and a 1,1-dimethylethylene group.

Examples of the tertiary alkyl group for $R^{51}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

The aryl group for each of $R^{1\prime\prime\prime}$ to $R^{3\prime\prime\prime}$ is preferably a phenyl group or a naphthyl group.

The alkyl group for $R^{1\prime\prime\prime}$ to $R^{3\prime\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

When two of $R^{1\prime\prime\prime}$ to $R^{3\prime\prime\prime}$ are bonded to each other to form a ring with the sulfur atom, it is preferable that the two of $R^{1\prime\prime\prime}$ to $R^{3\prime\prime\prime}$ form a 3 to 10-membered ring including the sulfur atom, and it is particularly desirable that the two of $R^{1\prime\prime\prime}$ to $R^{3\prime\prime\prime}$ form a 5 to 7-membered ring including the sulfur atom.

When two of $R^{1\prime\prime\prime}$ to $R^{3\prime\prime\prime}$ are bonded to each other to form a ring with the sulfur atom, the remaining one of $R^{1\prime\prime\prime}$ to $R^{3\prime\prime\prime}$ is preferably an aryl group. As examples of the aryl group, the same as the above-mentioned aryl groups for $R^{1\prime\prime\prime}$ to $R^{3\prime\prime\prime}$ can be given.

Specific examples of cation moiety represented by general formula (I-1) include triphenylsulfonium, (3,5-dimethylphenyl)diphenylsulfonium, (4-(2-adamantoxymethyloxy)-3,5-dimethylphenyl)diphenylsulfonium, (4-(2-adamantoxymethyloxy)phenyl)diphenylsulfonium, (4-(tert-butoxycarbonylmethyloxy)phenyl)diphenylsulfonium, (4-(tert-butoxycarbonylmethyloxy)-3,5-dimethylphenyl) diphenylsulfonium, (4-(2-methyl-2-adamantyloxycarbonylmethyloxy)phenyl) diphenylsulfonium, (4-(2-methyl-2-adamantyloxycarbonylmethyloxy)-3,5-dimethylphenyl) diphenylsulfonium, tri(4-methylphenyl)sulfonium, dimethyl (4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl)tetrahydrothiopyranium and 1-(4-methylphenyl)tetrahydrothiopyranium.

In formula (I-2), each of $R^{5\prime\prime\prime}$ and $R^{6\prime\prime\prime}$ independently represents an aryl group or alkyl group. At least one of $R^{5\prime\prime\prime}$ and $R^{6\prime\prime\prime}$ represents an aryl group. It is preferable that both of $R^{5\prime\prime\prime}$ and $R^{6\prime\prime\prime}$ represent an aryl group.

As the aryl group for $R^{5\prime\prime\prime}$ and $R^{6\prime\prime\prime}$, the same as the aryl groups for $R^{1\prime\prime\prime}$ to $R^{3\prime\prime\prime}$ can be used.

As the alkyl group for $R^{5\prime\prime\prime}$ and $R^{6\prime\prime\prime}$, the same as the alkyl groups for $R^{1\prime\prime\prime}$ to $R^{3\prime\prime\prime}$ can be used.

It is particularly desirable that both of $R^{5\prime\prime\prime}$ and $R^{6\prime\prime\prime}$ represents a phenyl group.

Specific examples of cation moiety represented by general formula (I-2) include diphenyliodonium and bis(4-tert-butylphenyl)iodonium.

Further, as a preferable example of a cation moiety for $A^+$, a cation moiety represented by general formula (I-5) or (I-6) shown below can be given.

[Chemical Formula 26.]

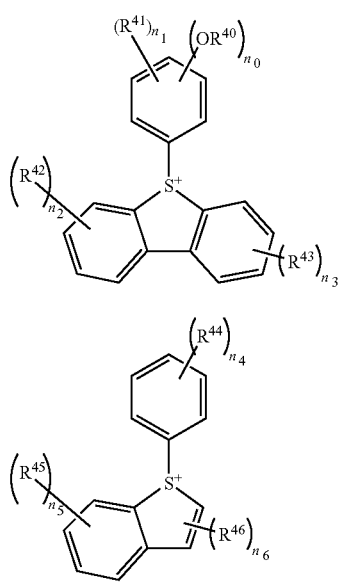

(I-5)

(I-6)

In the formulas, $R^{40}$ represents a hydrogen atom or an alkyl group; $R^{41}$ represents an alkyl group, an acetyl group, a carboxy group or a hydroxyalkyl group; each of $R^{42}$ to $R^{46}$ independently represents an alkyl group, an acetyl group, an alkoxy group, a carboxy group, or a hydroxyalkyl group; each of $n_0$ to $n_5$ independently represents an integer of 0 to 3, with the provision that $n_0+n_1$ is 5 or less; and $n_6$ represents an integer of 0 to 2.

In general formulas (I-5) and (I-6), with respect to $R^{40}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of the $OR^{40}$ group, as indicated by the value of $n_0$, then the two or more of the $OR^{40}$ group may be the same or different from each other.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_0$ is preferably 0 or 1.

$n_1$ is preferably 0 to 2.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1.

As $A^+$, a cation moiety represented by general formula (I-1) or (I-5) is preferable, and more preferably a cation moiety represented by any one of formulas (I-1-1) to (I-1-10) and (I-5-1) to (I-5-4) shown below. Among these, a cation moiety having a triphenyl skeleton, such as a cation moiety represented by any one of formulas (I-1-1) to (I-1-8) shown below is particularly desirable.

In formulas (I-1-9) and (I-1-10), each of $R^9$ and $R^{10}$ independently represents a phenyl group or naphthyl group which may have a substituent, an alkyl group of 1 to 5 carbon atoms, an alkoxy group or a hydroxy group.

u is an integer of 1 to 3, and most preferably 1 or 2.

[Chemical Formula 27.]

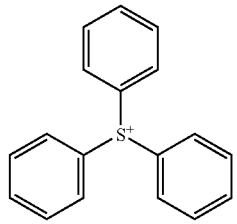

(I-1-1)

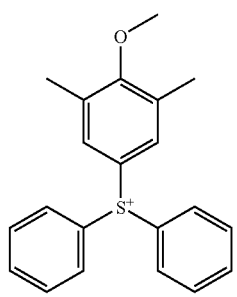

(I-1-2)

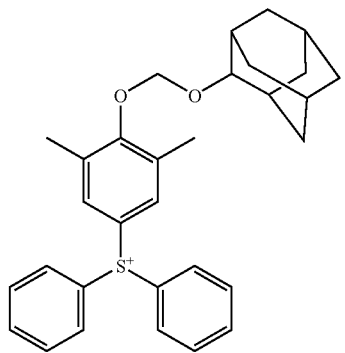

(I-1-3)

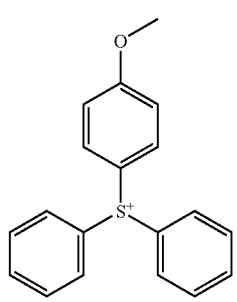

(I-1-4)

[Chemical Formula 28.]
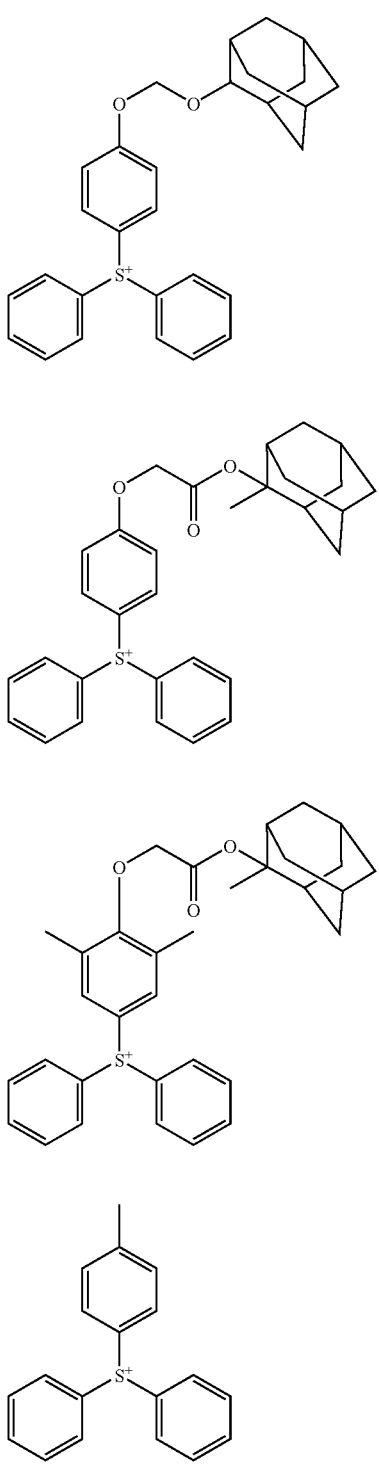
(I-1-5)
(I-1-6)
(I-1-7)
(I-1-8)
(I-1-9)
(I-1-10)
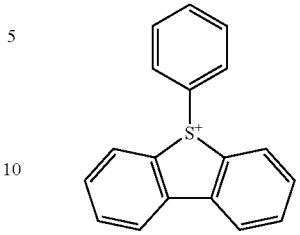
(I-5-1)
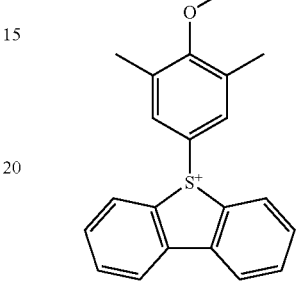
(I-5-2)
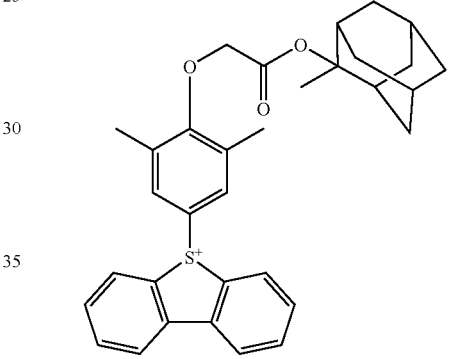
(I-5-3)
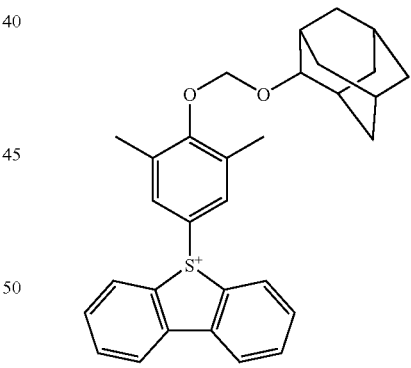
(I-5-4)
As the component (B1), a compound represented by general formula (b1-1) shown below is particularly desirable.
[Chemical Formula 29.]
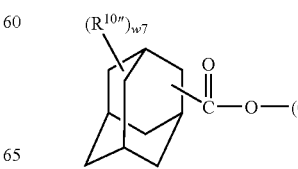
(b1-1)

In the formula, A$^+$ is as defined above; t3 represents an integer of 1 to 3; q3 represents an integer of 1 to 12; w7 represents an integer of 0 to 3; and R$^{10'''}$ represents a substituent.

Examples of the substituent for R$^{10'''}$ include an alkyl group, an alkoxy group, a halogen atom, a halogenated alkyl group, a hydroxyl group, an oxygen atom (=O) and a cyano group.

As the alkyl group, an alkyl group of 1 to 5 carbon atoms is preferable, and a methyl group, an ethyl group, a propyl group, an n-butyl group or a tert-butyl group is particularly desirable.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

If there are two or more of the R$^{10'''}$ group, as indicated by the value w7, then the two or more of the R$^{10'''}$ groups may be the same or different from each other.

t3 is preferably 1 or 2, and most preferably 1.

q3 is preferably 1 to 5, more preferably 1 to 3, and most preferably 1.

w7 is preferably an integer of 0 to 2, and more preferably 0 or 1.

As the component (B1), one type of acid generator may be used alone, or two or more types may be used in combination.

In the resist composition of the present invention, the amount of the component (B1) within the component (B) is preferably 50% by weight or more, more preferably 60% by weight or more, still more preferably 75% by weight or more, and most preferably 100% by weight. By ensuring that the amount of the component (B1) is at least as large as the lower limit of the above-mentioned range, the effects of the present invention can be improved.

[Component (B2)]

In the positive resist composition of the present invention, if desired, the component (B) may further include an acid generator other than the component (B1) (hereafter, referred to as "component (B2)").

The component (B2) is not particularly limited as long it does not fall under the category of the component (B1), and any of the known acid generators used in conventional chemically amplified resist compositions can be used. Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 30.]

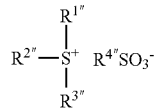

(b-1)

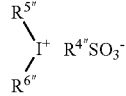

(b-2)

In formula (b-1), each of R$^{1''}$ to R$^{3''}$ independently represents an aryl group which may have a substituent or an alkyl group which may have a substituent, with the provision that at least one of R$^{1''}$ to R$^{3''}$ represents an aryl group, and two of R$^{1''}$ to R$^{3''}$ in formula (I-1) may be bonded to each other to form a ring with the sulfur atom. In formula (b-2), R$^{5''}$ and R$^{6''}$ each independently represent an aryl group which may have a substituent or an alkyl group which may have a substituent, with the provision that and at least one of R$^{5}$, and R$^{6''}$ represents an aryl group. The plurality of R$^{4''}$ each independently represents an alkyl group, a halogenated alkyl group, an aryl group or an alkenyl group which may have a substituent.

In general formula (b-1), R$^{1''}$ to R$^{3''}$ are respectively as defined for R$^{1''}$ to R$^{3''}$ in general formula (I-1).

In general formula (b-2), R$^{5''}$ and R$^{6''}$ are respectively as defined for R$^{5''}$ and R$^{6''}$ in general formula (I-2).

R$^{4''}$ represents an alkyl group, a halogenated alkyl group, an aryl group or an alkenyl group which may have a substituent.

The alkyl group for R$^{4''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for R$^{4''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

The aryl group for R$^{4''}$ is preferably an aryl group of 6 to 20 carbon atoms.

The alkenyl group for R$^{4''}$ is preferably an alkenyl group of 2 to 10 carbon atoms.

With respect to R$^{4''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

R$^{4''}$ may have one substituent, or two or more substituents.

Examples of substituents include a halogen atom, a hetero atom and an alkyl group.

Examples of halogen atoms and alkyl groups as substituents for $R^{4\prime\prime\prime}$ include the same halogen atoms and alkyl groups as those described above with respect to the halogenated alkyl group for $R^{4\prime\prime\prime}$.

Examples of hetero atoms include an oxygen atom, a nitrogen atom, and a sulfur atom.

In formula (b-2), $R^{5\prime\prime\prime}$ and $R^{6\prime\prime\prime}$ each independently represent an aryl group or alkyl group. At least one of $R^{5\prime\prime\prime}$ and $R^{6\prime\prime\prime}$ represents an aryl group. It is preferable that both of $R^{5\prime\prime\prime}$ and $R^{6\prime\prime\prime}$ represent an aryl group.

As the aryl group for $R^{5\prime\prime\prime}$ and $R^{6\prime\prime\prime}$, the same as the aryl groups for $R^{1\prime\prime\prime}$ to $R^{3\prime\prime\prime}$ can be used.

As the alkyl group for $R^{5\prime\prime\prime}$ and $R^{6\prime\prime\prime}$, the same as the alkyl groups for $R^{1\prime\prime\prime}$ to $R^{3\prime\prime\prime}$ can be used.

It is particularly desirable that both of $R^{5\prime\prime\prime}$ and $R^{6\prime\prime\prime}$ represents a phenyl group.

As $R^{4\prime\prime\prime}$ in formula (b-2), the same groups as those mentioned above for $R^{4\prime\prime\prime}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by an alkylsulfonate such as methanesulfonate, n-propanesulfonate, n-butanesulfonate, or n-octanesulfonate.

Further, onium salt acid generators in which the anion moiety in general formula (b-1) or (b-2) is replaced by an anion represented by general formula (b-3) or (b-4) shown below (the cation moiety is the same as (b-1) or (b-2)) may be used.

[Chemical Formula 31.]

(b-3)

(b-4)

In formulas (b-3) and (b-4) above, X″ represents an alkylene group of 2 to 6 carbon atoms in which at least one hydrogen atom has been substituted with a fluorine atom; and each of Y″ and Z″ independently represents an alkyl group of 1 to 10 carbon atoms in which at least one hydrogen atom has been substituted with a fluorine atom.

X″ represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y″ and Z″ independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X″ or those of the alkyl group for Y″ and Z″ within the above-mentioned range of the number of carbon atoms, the more the solubility in a resist solvent is improved.

Further, in the alkylene group for X″ or the alkyl group for Y″ and Z″, it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Further, onium salts having a cation moiety represented by general formula (I-5) or (I-6) above, and having a fluorinated alkylsulfonate ion (e.g., the anion moiety ($R^{4\prime\prime\prime}SO_3^-$) in general formula (b-1) or (b-2) above) or an anion moiety represented by general formula (b-3) or (b-4) above as the anion moiety, can be used.

Among these, as the anion moiety, a fluorinated alkylsulfonate ion is preferable, a fluorinated alkylsulfonate ion of 1 to 4 carbon atoms is more preferable, and a linear perfluoroalkylsulfonate ion of 1 to 4 carbon atoms is particularly desirable. Specific examples thereof include a trifluoromethylsulfonate ion, a heptafluoro-n-propanesulfonate ion and a nonafluoro-n-butanesulfonate ion.

In the present description, an oximesulfonate acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 32.]

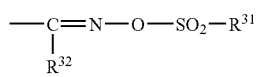
(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms, and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 33.]

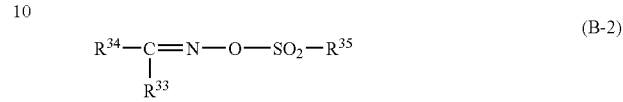
(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 34.]

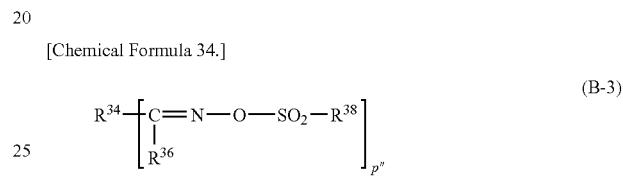
(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 85) may be preferably used.

Furthermore, as preferable examples, the following can be used.

[Chemical Formula 35.]

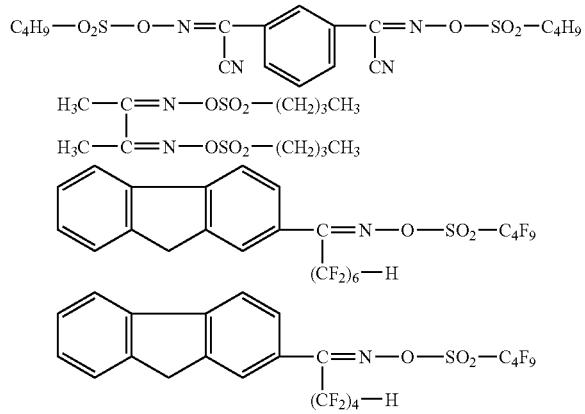

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B2), one type of acid generator may be used, or two or more types may be used in combination.

In the positive resist composition of the present invention, the amount of the component (B) relative to 100 parts by weight of the component (A) is preferably 0.5 to 50 parts by weight, more preferably 1 to 30 parts by weight, and most preferably 2 to 20 parts by weight.

By ensuring that the amount of the component (B) is within the above-mentioned range, formation of a resist pattern can be satisfactorily performed. Further, by virtue of the above-mentioned range, a uniform solution can be obtained and the storage stability becomes satisfactory.

<Optional Components>

In the positive resist composition of the present invention, for improving the resist pattern shape and the post exposure stability of the latent image formed by the pattern-wise exposure of the resist layer, it is preferable that a nitrogen-containing organic compound (D) (hereafter referred to as the component (D)) is further included as an optional component.

A multitude of these components (D) have already been proposed, and any of these known compounds may be used, although an aliphatic amine, and particularly a secondary aliphatic amine or tertiary aliphatic amine is preferable. The term "aliphatic cyclic group" refers to a monocyclic group or polycyclic group that has no aromaticity. An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, tri-n-octanolamine, laurildiethanolamine and stearyldiethanolamine. Among these, trialkylamines of 5 to 10 carbon atoms and alkylalcoholamines are preferable, tri-n-pentylamine, diethanolamine and stearyldiethanolamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

Examples of other aliphatic amines include tris(2-methoxymethoxyethyl)amine, tris {2-(2-methoxyethoxy)ethyl}amine, tris {2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine and tris[2-{2-(2-hydroxyethoxy)ethoxy}ethyl]amine.

These compounds can be used either alone, or in combinations of two or more different compounds.

The component (D) is typically used in an amount within a range from 0.01 to 5.0 parts by weight, relative to 100 parts by weight of the component (A).

Furthermore, in the positive resist composition of the present invention, for preventing any deterioration in sensitivity, and improving the resist pattern shape and the post exposure stability of the latent image formed by the patternwise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

<Organic Solvent (S)>

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate, depending on the thickness of the coating film. In general, the organic solvent is used in an amount such that the solid content of the resist composition becomes within the range from 2 to 20% by weight, and preferably from 5 to 15% by weight.

The positive resist composition of the present invention described above is a novel composition essentially unknown in the art.

By using the positive resist composition of the present invention, a resist pattern having an excellent shape can be formed. For example, in the formation of a hole pattern, the level of circularity of the holes and uniformity (CDU) of the hole diameter (CD) is improved, and as a result, a resist pattern in which holes having an excellent shape are spaced with a narrow pitch can be formed. The reasons why these effects can be achieved has not been elucidated yet, but are presumed as follows.

The positive resist composition of the present invention includes a component (A) containing at least one structural unit (a0) selected from the group consisting of a structural unit represented by general formula (a0-1) and a structural unit represented by general formula (a0-2), and an acid generator (B1) consisting of a compound represented by general formula (b1).

In the component (A), either of the "—$C(R^1)(R^2)(R^3)$" group in general formula (a0-1) and the $R^7$ group (acid dissociable, dissolution inhibiting group) in general formula (a0-2) are readily dissociated by the action of acid generated from the component (B1) upon exposure. Therefore it is presumed that, as compared to a conventional resist composition, the solubility of the component (A) in an alkali developing solution is increased, and the difference of solubility between exposed portions and unexposed portions in an alkali developing solution (i.e., dissolution contrast) is significantly improved.

Further, the component (B1) has a substituent containing an ester bond (—C(=O)—O—) and an aliphatic cyclic group in the anion moiety thereof. Therefore, the anion moiety of such a component (B1) exhibits a high polarity and has a three-dimensionally bulky structure, as compared to a fluorinated alkylsulfonate ion which has been used as an anion moiety of a conventional acid generator. As a result, the acid generated from the component (B1) upon exposure (i.e., the anion moiety of the component (B1)) is chemically and physically suppressed from diffusing within a resist film. Further, since the diffusion length is shorter than a conventional acid generator, diffusion of the acid generated in an exposed region to an unexposed portion can be appropriately controlled. Furthermore, when a resist film is formed, it is presumed that the component (B1) can be uniformly distributed within the resist film. Thus, it is presumed that the aforementioned effects can be achieved by using the component (B1).

<<Method of Forming a Resist Pattern>>

The method of forming a resist pattern according to the present invention includes: applying a positive resist composition of the present invention to a substrate to form a resist film on the substrate; conducting exposure of the resist film; and alkali-developing the resist film to form a resist pattern.

More specifically, the method for forming a resist pattern according to the present invention can be performed, for example, as follows.

More specifically, the method for forming a resist pattern according to the present invention can be performed, for example, as follows. Firstly, a positive resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, alkali developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the alkali developing. In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, exposure (immersion exposure) is conducted in a state where the region between the lens and the resist layer formed on a wafer (which was conventionally filled with air or an inert gas such as nitrogen) is filled with a solvent (a immersion medium) that has a larger refractive index than the refractive index of air.

More specifically, in immersion lithography, the region between the resist film formed in the above-described manner and lens at the lowermost portion of the exposure apparatus is filled with a solvent (a immersion medium) that has a larger refractive index than the refractive index of air, and in this state, the resist film is subjected to exposure (immersion exposure) through a desired mask pattern.

The immersion medium preferably exhibits a refractive index larger than the refractive index of air but smaller than the refractive index of the resist film to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

The positive resist composition of the present invention is also applicable to a double exposure method or a double patterning method.

EXAMPLES

As follows is a description of examples of the present invention, although the scope of the present invention is by no way limited by these examples.

Synthesis Example 1

Synthesis of 2-(2-(2-methyl-2-adamantyloxy)-2-oxoethoxy)-2-oxoethanol 37.6 g (494 mmol) of glycolic acid, 700 mL of DMF, 86.5 g (626 mmol) of potassium carbonate, and 28.3 g (170 mmol) of potassium iodide were added to a 2 L three-neck flask equipped with a thermometer, a cooling pipe, and a stirrer, followed by stirring at room temperature for 30 minutes. Then, 300 ml of a dimethylformaldehyde solution containing 100 g (412 mmol) of 2-methyl-2-adamantyl chloroacetate was gradually added thereto. The resultant was heated to 40° C., and stirred for 4 hours. Subsequently, 2,000 ml of diethylether was added to the reaction mixture, followed by filtration. The resulting solution was washed with 500 ml of distilled water three times. Then, crystallization was conducted using a mixed solvent containing 300 ml of toluene and 200 ml of heptane, thereby obtaining 78 g of an objective compound in the form of a colorless solid (yield: 67%, GC purity: 99%).

The results of instrumental analysis of the obtained compound were as follows.

$^1$H-NMR: 1.59 (d, 2H, J=12.5 Hz), 1.64 (s, 3H), 1.71-1.99 (m, 10H), 2.29 (m, 2H), 2.63 (t, 1H, J=5.2 Hz), 4.29 (d, 2H, J=5.2 Hz), 4.67 (s, 2H).

$^{13}$C-NMR: 22.35, 26.56, 27.26, 32.97, 34.54, 36.29, 38.05, 60.54, 61.50, 89.87, 165.97, 172.81.

GC-MS: 282 (M+, 0.02%), 165 (0.09%), 149 (40%), 148 (100%), 133 (22%), 117 (2.57%), 89 (0.40%).

From the results above, it was confirmed that the obtained compound was 2-(2-(2-methyl-2-adamantyloxy)-2-oxoethoxy)-2-oxoethanol.

Synthesis Example 2

Synthesis of 2-(2-(2-methyl-2-adamantyloxy)-2-oxoethoxy)-2-oxoethyl methacrylate (Compound 3)

165 g (584 mmol) of 2-(2-(2-methyl-2-adamantyloxy)-2-oxoethoxy)-2-oxoethanol, 2,000 ml of THF, 105 ml (754 mmol) of triethylamine, and 0.165 g (1,000 ppm) of p-methoxyphenol were added to and dissolved in a 2 L three-neck flask equipped with a thermometer, a cooling pipe, and a stirrer. Then, 62.7 ml (648 mmol) of methacryloyl chloride was gradually added thereto while cooling in an ice bath. The temperature of the resultant was elevated to room temperature, and the resultant was stirred for 3 hours. Subsequently, 1,000 ml of diethylether was added thereto, followed by washing with 200 ml of distilled water 5 times. Thereafter, the extraction liquid was concentrated, thereby obtaining 198 g of an objective compound (compound 3) in the form of a colorless liquid (yield: 97%, GC purity: 99%).

The results of instrumental analysis of the obtained compound 3 were as follows.

$^1$H-NMR: 1.58 (d, J=12.5 Hz, 2H), 1.63 (s, 3H), 1.71-1.89 (m, 8H), 1.98 (s, 3H), 2.00 (m, 2H), 2.30 (m, 2H), 4.62 (s, 2H), 4.80 (s, 2H), 5.66 (m, 1H), 6.23 (m, 1H).

$^{13}$C-NMR: 18.04, 22.15, 26.42, 27.14, 32.82, 34.38, 36.11, 37.92, 60.44, 61.28, 89.42, 126.79, 135.18, 165.61, 166.30, 167.20.

GC-MS: 350 (M+, 1.4%), 206 (0.13%), 149 (47%), 148 (100%), 133 (20%), 69 (37%).

Production Example 1

Synthesis of Polymeric Compound (1)

7.77 g (45.71 mmol) of the [compound 1] shown below, 11.99 g (45.71 mmol) of the [compound 2] shown below, 6.22 g (17.78 mmol) of the [compound 3] shown below which was obtained in the aforementioned Synthesis Example 2, and 1.80 g (7.62 mmol) of the [compound 4] shown below were added to a 500 ml beaker, and were dissolved in 127.16 g of methyl ethyl ketone. Then, 4.1 mmol of dimethyl azobisisobutyrate (V-601) as a radical polymerization initiator was added to and dissolved in the resulting solution. The reaction solution was dropwise added to 52.98 g of methyl ethyl ketone heated to 75° C. in a separable flask over 6 hours in a nitrogen atmosphere. The resulting reaction solution was heated while stirring for 1 hour, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 15 g of the polymeric compound (1) as an objective compound.

With respect to the polymeric compound (1), the weight average molecular weight (Mw) and the dispersity (Mw/Mn) were determined by the polystyrene equivalent value as measured by gel permeation chromatography (GPC). As a result, it was found that the weight average molecular weight was 7,400, and the dispersity was 1.74.

Further, the polymeric compound (1) was analyzed by carbon 13 nuclear magnetic resonance spectroscopy (600 MHz, $^{13}$C-NMR). As a result, it was found that the composition of the polymer (ratio (molar ratio) of the respective structural units within the structural formula shown below) was l/m/n/o=45.3/20/23.4/11.3.

Production Example 2

Synthesis of Polymeric Compound (2)

7.03 g (41.36 mmol) of the [compound 1] shown below, 11.99 g (45.71 mmol) of the [compound 2] shown below, 3.43 g (9.79 mmol) of the [compound 3] shown below which was obtained in the aforementioned Synthesis Example 2, and 1.80 g (7.62 mmol) of the [compound 4] shown below were added to a 500 ml beaker, and were dissolved in 113.04 g of methyl ethyl ketone. Then, 3.6 mmol of dimethyl azobisisobutyrate (V-601) as a radical polymerization initiator was added to and dissolved in the resulting solution. The reaction solution was dropwise added to 47.10 g of methyl ethyl ketone heated to 75° C. in a separable flask over 6 hours in a nitrogen atmosphere. The resulting reaction solution was heated while stirring for 1 hour, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 15 g of the polymeric compound (2) as an objective compound (the chemical formula of the polymeric compound (2) is the same as that of the polymeric compound (1)).

With respect to the polymeric compound (2), the weight average molecular weight (Mw) and the dispersity (Mw/Mn) were determined by the polystyrene equivalent value as measured by gel permeation chromatography (GPC). As a result, it was found that the weight average molecular weight was 7,000, and the dispersity was 1.59.

Further, the polymeric compound (2) was analyzed by carbon 13 nuclear magnetic resonance spectroscopy (600 MHz, $^{13}$C-NMR). As a result, it was found that the composition of the polymer (ratio (molar ratio) of the respective structural units within the structural formula shown below) was l/m/n/o=47.6/26.9/12.9/12.6.

Production Example 3

Synthesis of Polymeric Compound (3)

7.77 g (45.71 mmol) of the [compound 1] shown below, 31.14 g (118.85 mmol) of the [compound 2] shown below, 16.00 g (45.71 mmol) of the [compound 3] shown below which was obtained in the aforementioned Synthesis Example 2, and 4.32 g (18.28 mmol) of the [compound 4] shown below were added to a 500 ml beaker, and were dissolved in 236.92 g of methyl ethyl ketone. Then, 13.71 mmol of dimethyl azobisisobutyrate (V-601) as a radical polymerization initiator was added to and dissolved in the resulting solution. The reaction solution was dropwise added to 98.72 g of methyl ethyl ketone heated to 75° C. in a separable flask over 6 hours in a nitrogen atmosphere. The resulting reaction solution was heated while stirring for 1 hour, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 20 g of the polymeric compound (3) as an objective compound.

With respect to the polymeric compound (3), the weight average molecular weight (Mw) and the dispersity (Mw/Mn) were determined by the polystyrene equivalent value as measured by gel permeation chromatography (GPC). As a result, it was found that the weight average molecular weight was 7,000, and the dispersity was 1.51.

Further, the polymeric compound (3) was analyzed by carbon 13 nuclear magnetic resonance spectroscopy (600 MHz, $^{13}$C-NMR). As a result, it was found that the composition of the polymer (ratio (molar ratio) of the respective structural units within the structural formula shown below) was l/m/n/o=30/40/20/10.

Production Example 4

Synthesis of Polymeric Compound (4)

3.42 g (20.11 mmol) of the [compound 1] shown below, 11.99 g (45.71 mmol) of the [compound 2] shown below, 5.22 g (15.54 mmol) of the [compound 3] shown below which was obtained in the aforementioned Synthesis Example 2, and 1.73 g (7.31 mmol) of the [compound 4] shown below were added to a 500 ml beaker, and were dissolved in 105.48 g of methyl ethyl ketone. Then, 2.2 mmol of dimethyl azobisisobutyrate (V-601) as a radical polymerization initiator was added to and dissolved in the resulting solution. The reaction solution was dropwise added to 43.95 g of methyl ethyl ketone heated to 75° C. in a separable flask over 6 hours in a nitrogen atmosphere. The resulting reaction solution was heated while stirring for 1 hour, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 20 g of the polymeric compound (4) as an objective compound.

With respect to the polymeric compound (4), the weight average molecular weight (Mw) and the dispersity (Mw/Mn) were determined by the polystyrene equivalent value as measured by gel permeation chromatography (GPC). As a result, it was found that the weight average molecular weight was 7,800, and the dispersity was 1.59.

Further, the polymeric compound (4) was analyzed by carbon 13 nuclear magnetic resonance spectroscopy (600 MHz, $^{13}$C-NMR). As a result, it was found that the composition of the polymer (ratio (molar ratio) of the respective structural units within the structural formula shown below) was l/m/n/o=30/50/10/10.

Production Example 5

Synthesis of Polymeric Compound (5)

3.11 g (18.28 mmol) of the [compound 1] shown below, 11.99 g (45.71 mmol) of the [compound 2] shown below, 6.40 g (18.28 mmol) of the [compound 3] shown below which was obtained in the aforementioned Synthesis Example 2, and 1.73 g (7.31 mmol) of the [compound 4] shown below were added to a 500 ml beaker, and were dissolved in 108.96 g of methyl ethyl ketone. Then, 3.1 mmol of dimethyl azobisisobutyrate (V-601) as a radical polymerization initiator was added to and dissolved in the resulting solution. The reaction solution was dropwise added to 45.40 g of methyl ethyl ketone heated to 75° C. in a separable flask over 6 hours in a nitrogen atmosphere. The resulting reaction solution was heated while stirring for 1 hour, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 15 g of the polymeric compound (5) as an objective compound.

With respect to the polymeric compound (5), the weight average molecular weight (Mw) and the dispersity (Mw/Mn) were determined by the polystyrene equivalent value as measured by gel permeation chromatography (GPC). As a result, it was found that the weight average molecular weight was 7,100, and the dispersity was 1.59.

Further, the polymeric compound (5) was analyzed by carbon 13 nuclear magnetic resonance spectroscopy (600 MHz, $^{13}$C-NMR). As a result, it was found that the composition of the polymer (ratio (molar ratio) of the respective structural units within the structural formula shown below) was l/m/n/o=24.9/31.9/28.7/14.5.

Production Example 6

Synthesis of Polymeric Compound (6)

2.93 g (17.23 mmol) of the [compound 1] shown below, 11.99 g (45.71 mmol) of the [compound 2] shown below, 2.89 g (8.25 mmol) of the [compound 3] shown below which was obtained in the aforementioned Synthesis Example 2, and 1.59 g (6.74 mmol) of the [compound 4] shown below were added to a 500 ml beaker, and were dissolved in 93.64 g of methyl ethyl ketone. Then, 2.7 mmol of dimethyl azobisisobutyrate (V-601) as a radical polymerization initiator was added to and dissolved in the resulting solution. The reaction solution was dropwise added to 39.02 g of methyl ethyl ketone heated to 75° C. in a separable flask over 6 hours in a nitrogen atmosphere. The resulting reaction solution was heated while stirring for 1 hour, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 15 g of the polymeric compound (6) as an objective compound.

With respect to the polymeric compound (6), the weight average molecular weight (Mw) and the dispersity (Mw/Mn) were determined by the polystyrene equivalent value as measured by gel permeation chromatography (GPC). As a result, it was found that the weight average molecular weight was 7,100, and the dispersity was 1.52.

Further, the polymeric compound (6) was analyzed by carbon 13 nuclear magnetic resonance spectroscopy (600 MHz, $^{13}$C-NMR). As a result, it was found that the composition of the polymer (ratio (molar ratio) of the respective structural units within the structural formula shown below) was l/m/n/o=29.0/38.9/16.5/15.6.

[Chemical Formula 36.]

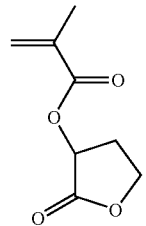

[Compound 1]

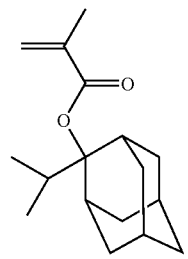

[Compound 2]

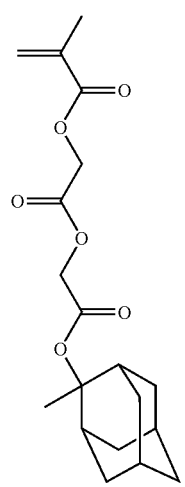

[Compound 3]

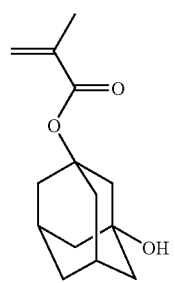

[Compound 4]

[Chemical Formula 37.]

Polymeric compounds (1) to (6)

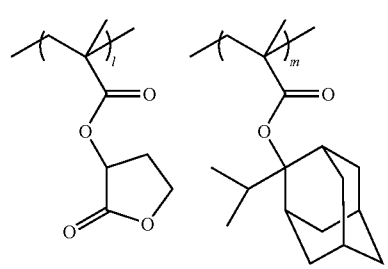

-continued

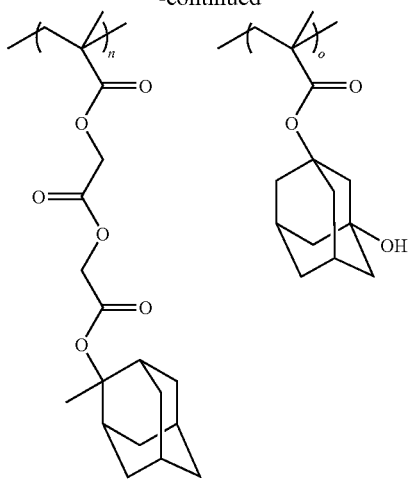

Synthesis Example 3

Synthesis of Compound (3a)

4.8 g of sodium hydride (NaH) was added to a 1 L three-necked flask. While maintaining the temperature of the three-necked flask at 0° C. in an ice bath, 300 g of tetrahydrofuran (THF) was added, 124 g of a compound (1a) was further added while stirring, and stirring was continued for 10 minutes. Then, 30 g of a compound (2a) was added while stirring, and a reaction was effected for 12 hours. After the completion of the reaction, the reaction mixture was subjected to suction filtration, and THF was removed from the obtained filtrate by concentration under reduced pressure. Then, water and ethyl acetate was added to the concentrated liquid, and extraction was conducted. The resulting ethyl acetate solution was concentrated under reduced pressure, and purified by column chromatography (SiO$_2$, heptane:ethyl acetate=8:2). The obtained fraction was concentrated and dried under reduced pressure, thereby obtaining 12 g of a compound (3a).

[Chemical Formula 38.]

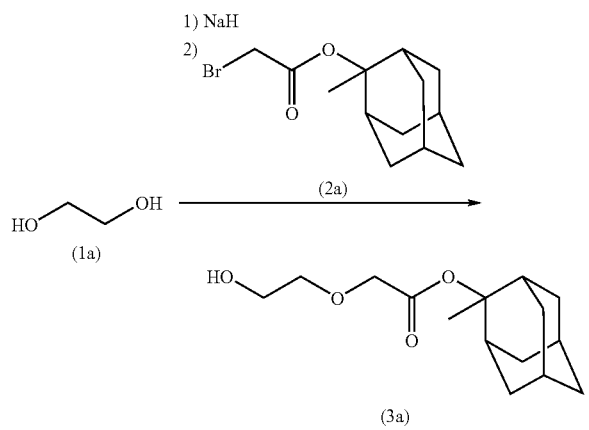

The obtained compound (3a) was analyzed by $^1$H-NMR. The results are shown below.

$^1$H-NMR (solvent: CDCl$_3$, 400 MHz): δ (ppm)=4.09 (s, 2H(H$^a$)), 3.75 (t, 2H(H$^b$)), 3.68 (t, 2H(H$^c$)), 3.03 (brs, 2H(H$^d$)), 1.51-2.35 (m, 17H(H$^e$)).

From the results shown above, it was confirmed that the compound (3a) had a structure shown below.

[Chemical Formula 39.]

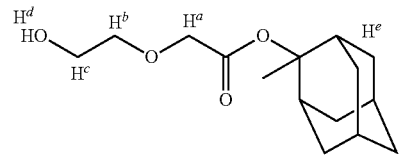

Synthesis Example 4

Synthesis of Compound (6)

5 g of the compound (3a), 3.04 g of triethylamine (Et$_3$N) and 10 g of THF were added to a 300 mL three-necked flask, followed by stirring for 10 minutes. Then, 2.09 g of a compound (4a) and 10 g of THF were added to the three-necked flask, and a reaction was effected at room temperature for 12 hours. After the completion of the reaction, the reaction mixture was subjected to suction filtration, and THF was removed from the obtained filtrate by concentration under reduced pressure. Then, water and ethyl acetate was added to the concentrated liquid, and extraction was conducted. The resulting ethyl acetate solution was concentrated under reduced pressure, and purified by column chromatography (SiO$_2$, heptane:ethyl acetate=8:2). The obtained fraction was concentrated and dried under reduced pressure, thereby obtaining 4.9 g of a compound (6).

[Chemical Formula 40.]

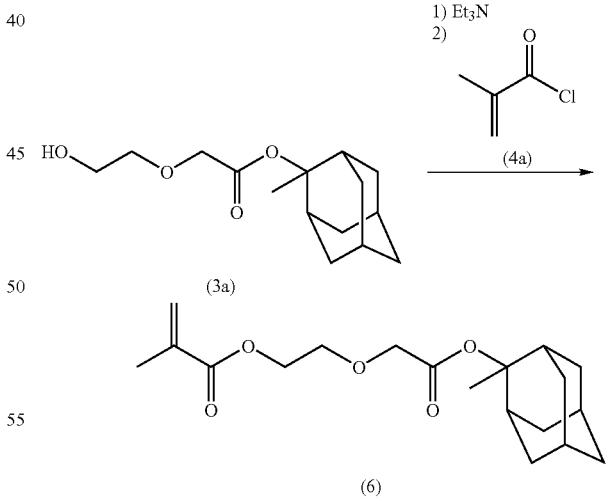

The obtained compound (6) was analyzed by $^1$H-NMR. The results are shown below.

$^1$H-NMR (solvent: CDCl$_3$, 400 MHz): δ (ppm)=6.15 (s, 1H(H$^a$)), 5.58 (s, 1H(H$^b$)), 4.35 (t, 2H(H$^c$)), 4.08 (s, 2H(H$^d$)), 3.80 (t, 2H(H$^e$)), 1.51-2.35 (m, 20H(H$^f$)).

From the results shown above, it was confirmed that the compound (6) had a structure shown below.

[Chemical Formula 40.]

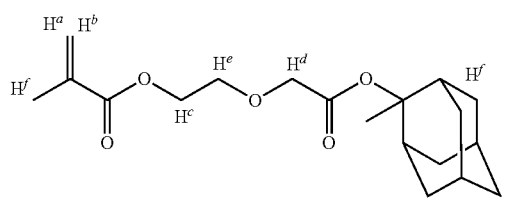

Production Example 7

Synthesis of Polymeric Compound (7)

18.05 g (106.17 mmol) of the [compound 1], 20.06 g (80.89 mmol) of [compound 5] shown below, 15.04 g (42.97 mmol) of the [compound 3] and 5.37 g (22.75 mmol) of the [compound 4] were added to a 500 ml beaker, and were dissolved in 234.08 g of methyl ethyl ketone. Then, 17.7 mmol of dimethyl azobisisobutyrate (V-601) as a radical polymerization initiator was added to and dissolved in the resulting solution. The reaction solution was dropwise added to 97.53 g of methyl ethyl ketone heated to 75° C. in a separable flask over 6 hours in a nitrogen atmosphere. The resulting reaction solution was heated while stirring for 1 hour, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 35 g of the polymeric compound (7) as an objective compound.

With respect to the polymeric compound (7), the weight average molecular weight and the dispersity were determined by the polystyrene equivalent value as measured by gel permeation chromatography (GPC). As a result, it was found that the weight average molecular weight was 8,900, and the dispersity was 1.95.

Further, the polymeric compound (7) was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m/n=52.4/19.6/18.7/9.4.

[Chemical Formula 42.]

[Compound 5]

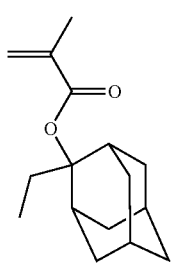

-continued

Polymeric compound (7)

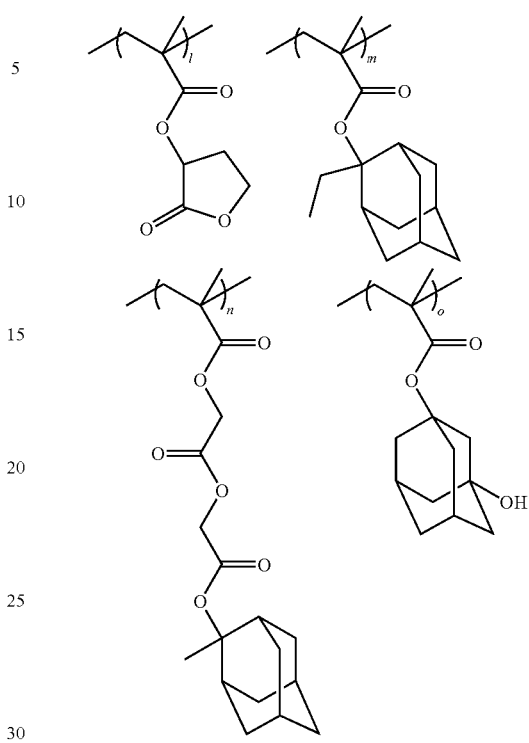

Production Example 8

Synthesis of Polymeric Compound (8)

18.05 g (106.17 mmol) of the [compound 1], 20.06 g (80.89 mmol) of the [compound 5], 14.45 g (43 mmol) of the compound (6) obtained in Synthesis Example 4 and 5.37 g (22.75 mmol) of the [compound 4] were added to a 500 ml beaker, and were dissolved in 234.08 g of methyl ethyl ketone. Then, 17.7 mmol of dimethyl azobisisobutyrate (V-601) as a radical polymerization initiator was added to and dissolved in the resulting solution. The reaction solution was dropwise added to 97.53 g of methyl ethyl ketone heated to 75° C. in a separable flask over 6 hours in a nitrogen atmosphere. The resulting reaction solution was heated while stirring for 1 hour, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining a polymeric compound (8) as an objective compound.

With respect to the polymeric compound (8), the weight average molecular weight and the dispersity were determined by the polystyrene equivalent value as measured by gel permeation chromatography (GPC). As a result, it was found that the weight average molecular weight was 8,900, and the dispersity was 1.95.

Further, the polymeric compound (8) was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m/n=50/20/20/10.

[Chemical Formula 43.]

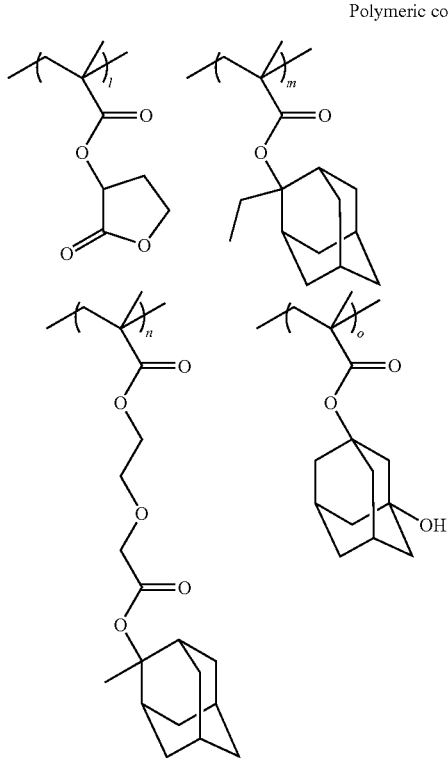

Polymeric compound (8)

[Chemical Formula 44.]

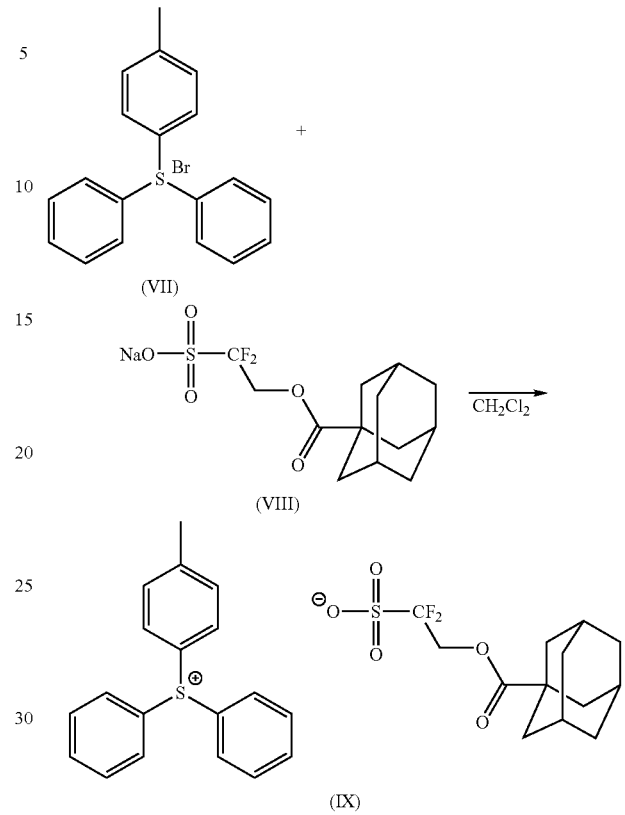

Synthesis Example 5

Synthesis of Compound (IX)

35.6 g of a compound (VII) (TDPS-Br) was dissolved in 360 g of pure water, and 360 g of dichloromethane and 38.0 g of a compound (VIII) were added, followed by stirring at room temperature for 14 hours. Then, the dichloromethane phase was separated, and washed with a diluted hydrochloric acid and water in this order. Thereafter, the resultant was concentrated and dried, thereby obtaining, as an objective compound, 58 g of a compound (IX) in the form of a white solid.

The compound (IX) was analyzed by NMR.

$^{1}$H-NMR (DMSO-d6, 400 MHz):

δ (ppm)=1.64 (m, 6H, Ad), 1.82 (m, 6H, Ad), 1.94 (m, 3H, Ad), 3.35 (s, 3H, CH3), 4.55 (t, 2H, CF2CH2), 7.56 (d, 2H, Ar), 7.72-7.84 (m, 12H, Ar).

$^{19}$F-NMR (DMSO-d6, 376 MHz): δ (ppm)=−111.2.

From the results above, it was confirmed that the compound (IX) had a structure as shown in formula (IX) above.

Examples 1 to 8, Comparative Examples 1 and 2

The components shown in Table 1 were mixed together and dissolved to obtain positive resist compositions.

TABLE 1

|  | Composition [parts by weight] | | | | PAB/PEB (60 sec) (° C.) | Target size (Hole diameter/ Pitch) | Sensitivity (mJ/cm$^2$) | Shape |
|---|---|---|---|---|---|---|---|---|
|  | Component (A) | Component (B) | Component (D) | Component (S) |  |  |  |  |
| Ex. 1 | (A)-1 [100] | (B)-1 [10.0] | (D)-1 [1.0] | (S)-1 [2400] | 90/85 | 70/113 | 31 | A |
| Ex. 2 | (A)-2 [100] | (B)-1 [10.0] | (D)-1 [1.0] | (S)-1 [2400] | 90/85 | 70/113 | 28 | A |
| Ex. 3 | (A)-3 [100] | (B)-1 [10.0] | (D)-1 [1.0] | (S)-1 [2400] | 90/85 | 70/113 | 30 | A |
| Ex. 4 | (A)-4 [100] | (B)-1 [10.0] | (D)-1 [1.0] | (S)-1 [2400] | 90/85 | 70/113 | 27 | A |
| Ex. 5 | (A)-5 [100] | (B)-1 [10.0] | (D)-1 [1.0] | (S)-1 [2400] | 90/85 | 70/113 | 30 | A |
| Ex. 6 | (A)-6 [100] | (B)-1 [10.0] | (D)-1 [1.0] | (S)-1 [2400] | 90/85 | 70/113 | 28 | A |

TABLE 1-continued

| | Composition [parts by weight] | | | | PAB/PEB (60 sec) (°C.) | Target size (Hole diameter/ Pitch) | Sensitivity (mJ/cm$^2$) | Shape |
|---|---|---|---|---|---|---|---|---|
| | Component (A) | Component (B) | Component (D) | Component (S) | | | | |
| Comp. Ex. 1 | (A)-1 [100] | (B)-2 [10.0] | (D)-1 [1.0] | (S)-1 [2400] | 90/85 | 70/113 | 20 | B |
| Comp. Ex. 2 | (A)-9 [100] | (B)-1 [10.0] | (D)-1 [1.0] | (S)-1 [2400] | 90/90 | 70/113 | 27 | B |
| Ex. 7 | (A)-7 [100] | (B)-1 [8.0] | (D)-1 [1.0] | (S)-1 [2400] | 90/90 | 70/113 | 17 | A |
| Ex. 8 | (A)-8 [100] | (B)-1 [8.0] | (D)-1 [1.0] | (S)-1 [2400] | 90/90 | 70/113 | 22 | A |

In Table 1, the values in brackets [ ] indicate the amount (in terms of parts by weight) of the component added. Further, the reference characters indicate the following.

(A)-1: the aforementioned polymeric compound (1)
(A)-2: the aforementioned polymeric compound (2)
(A)-3: the aforementioned polymeric compound (3)
(A)-4: the aforementioned polymeric compound (4)
(A)-5: the aforementioned polymeric compound (5)
(A)-6: the aforementioned polymeric compound (6)
(A)-7: the aforementioned polymeric compound (7)
(A)-8: the aforementioned polymeric compound (8)
(A)-9: a polymeric compound represented by formula (A)-9 shown below [Mw: 7,000, Mw/Mn: 1.4] In the formula shown below, each of the subscript numerals at the lower right of the brackets indicate the amount (mol %) of the respective structural units.

[Chemical Formula 45.]

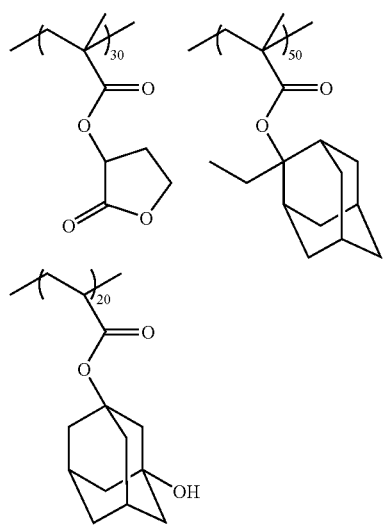

(A)-9

(B)-1: the aforementioned compound (IX)
(B)-2: (4-methylphenyl)diphenylsulfonium nonafluoro-n-butanesulfonate
(D)-1: stearyldiethanolamine
(S)-1: a mixed solvent of PGMEA/PGME=6/4 (weight ratio)

Using the obtained positive resist compositions, resist patterns were formed in the following manner, and the lithography properties were evaluated.

[Resolution and Sensitivity]

An organic anti-reflection film composition (product name: ARC29A, manufactured by Brewer Science Ltd.) was applied onto an 12-inch silicon wafer using a spinner, and the composition was then baked at 205° C. for 60 seconds, thereby forming an organic anti-reflection film having a film thickness of 89 nm. Then, each of the positive resist compositions obtained in Examples 1 to 8 and Comparative Examples 1 and 2 was applied onto the organic anti-reflection film using a spinner, and was then prebaked (PAB) on a hotplate under the conditions indicated in Table 1 and dried, thereby forming a resist film having a film thickness of 120 nm.

Subsequently, a coating solution for forming a protection film (product name: TSRC-002; manufactured by Tokyo Ohka Kogyo Co., Ltd.) was applied onto the resist film using a spinner, and then heated at 90° C. for 60 seconds, thereby forming a top coat with a film thickness of 28 nm.

Thereafter, using an ArF exposure apparatus for immersion lithography (product name: NSR-S609B, manufactured by Nikon Corporation, NA (numerical aperture)=1.07, 2/3 annular illumination, reduction ratio: 1/4, immersion medium: water), the resist film having a top coat formed thereon was selectively irradiated with an ArF excimer laser (193 nm) through a mask pattern (6% halftone) targeting a contact hole pattern having a target size (hole diameter (nm)/pitch (nm)) indicated in Table 1.

Next, the top coat was removed using a protection-film removing solution (product name: TS-Remover-S; manufactured by Tokyo Ohka Kogyo Co., Ltd.). Then, a post exposure bake (PEB) treatment was conducted under the conditions indicated in Table 1, followed by development for 30 seconds at 23° C. in a 2.38% by weight aqueous solution of tetramethylammonium hydroxide (product name: NMD-W; manufactured by Tokyo Ohka Kogyo Co., Ltd.). Then, the resist film was rinsed for 25 seconds with pure water, followed by drying by shaking.

As a result, in each of the examples, a contact hole pattern having a hole diameter of 70 nm and a pitch of 113 nm was formed.

The optimum exposure dose (Eop, mJ/cm$^2$) with which the contact hole pattern was formed, i.e., sensitivity, is shown in Table 1.

[Shape]

Each of the contact hole patterns formed above was observed from the upper side thereof using a scanning electron microscope (SEM), and the circularity was evaluated with the following criteria. The results are shown in Table 1.

A: the hole pattern as a whole exhibited high circularity (only slight unevenness was observed at the circumferential portions of the hole pattern when the hole pattern was observed from the upper side thereof), and the pattern shape was excellent B: a portion of the holes within the hole pattern was connected, and circularity of the pattern was low As seen from the results above, it was confirmed that by using the positive resist composition of the present invention, a contact hole pattern having a hole diameter of 70 nm and a pitch of 113 nm (i.e., a fine pattern having a size of no more than 100 nm and a narrow pitch) could be formed without deteriorating the shape thereof.

Thus, it was confirmed that by using the positive resist composition and method of forming a resist pattern according to the present invention, a resist pattern having an excellent shape can be formed.

What is claimed is:

1. A positive resist composition comprising a resin component (A) which exhibits increased solubility in an alkali developing solution under action of acid and an acid-generator component (B) which generates acid upon irradiation exposure with any form of radiation, said resin component (A) comprising at least one structural unit (a0) selected from the group consisting of a structural unit represented by general formula (a0-1) shown below and a structural unit represented by general formula (a0-2) shown below, and said acid-generator component (B) comprising an acid generator (B1) consisting of a compound represented by general formula (b1) shown below:

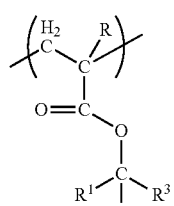
(a0-1)

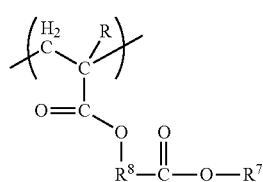
(a0-2)

wherein, in formula (a0-1), R represents a hydrogen atom, a lower alkyl group of 1 to 5 carbon atoms or a halogenated lower alkyl group of 1 to 5 carbon atoms; $R^1$ represents a branched alkyl group of 3 or more carbon atoms; and each of $R^2$ and $R^3$ independently represents an alkyl group, wherein $R^2$ and $R^3$ may be mutually bonded to form a polycyclic group; and in general formula (a0-2), R represents a hydrogen atom, a lower alkyl group of 1 to 5 carbon atoms or a halogenated lower alkyl group of 1 to 5 carbon atoms; $R^8$ represents a divalent linking group that contains no halogen atom; and $R^7$ represents an acid dissociable, dissolution inhibiting group;

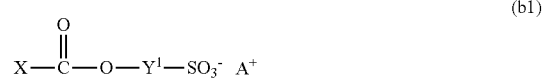
(b1)

wherein $Y^1$ represents a fluorinated alkylene group of 1 to 4 carbon atoms which may have a substituent; X represents an aliphatic cyclic group of 3 to 30 carbon atoms which may have a substituent; and $A^+$ represents an organic cation.

2. The positive resist composition according to claim 1, wherein said resin component (A) further comprises a structural unit (a2) derived from an acrylate ester containing a lactone-containing cyclic group.

3. The positive resist composition according to claim 1, wherein said resin component (A) further comprises a structural unit (a3) derived from an acrylate ester containing a polar group-containing aliphatic hydrocarbon group.

4. The positive resist composition according to claim 1, which further comprises a nitrogen-containing organic compound (D).

5. A method of forming a resist pattern, comprising: applying a positive resist composition according to claim 1 to a substrate to form a resist film;

subjecting said resist film to irradiation exposure with any form of radiation while said resist film is immersed in an immersion medium; and subjecting said resist film to alkali developing to form a resist pattern.

* * * * *

UNITED STATES PATENT AND TRADEMARK OFFICE
CERTIFICATE OF CORRECTION

Page 1 of 2

PATENT NO. : 8,211,616 B2
APPLICATION NO. : 12/500528
DATED : July 3, 2012
INVENTOR(S) : Hiroaki Shimizu et al.

It is certified that error appears in the above-identified patent and that said Letters Patent is hereby corrected as shown below:

In the Specifications

At Column 1, Lines 9-11 (Approx.), Delete "Priority is claimed.......... by reference." and insert the same on Col. 1, Line 3, below "Title".

At Column 6, Line 42 (Approx.), Change "(a0-1)" to --(a0-1-1)--.

At Column 7, Line 27 (Approx.), Change "(a0-1)" to --(a0-1-1)--.

At Column 30, Line 2, Change "s" to --s is--.

At Column 38, Line 33, Change "$R^{5''}$," to --$R^{5''}$--.

At Column 38, Line 36, Change "$R^5$," to --$R^{5''}$--.

At Column 40, Line 19 (Approx.), Change "$R^1$' to" to --$R^1$'' to--.

At Column 46, Line 23 (Approx.), Change "$R^5$," to --$R^{5''}$--.

At Column 50, Lines 24-26 (Approx.),

Change "
$$R^{34}-\left[\begin{array}{c} C=N-O-SO_2-R^{38} \\ | \\ R^{36} \end{array}\right]_{p''}$$
"

to --
$$R^{37}-\left[\begin{array}{c} C=N-O-SO_2-R^{38} \\ | \\ R^{36} \end{array}\right]_{p''}$$
--.

Signed and Sealed this
Sixteenth Day of April, 2013

Teresa Stanek Rea
*Acting Director of the United States Patent and Trademark Office*

CERTIFICATE OF CORRECTION (continued)
U.S. Pat. No. 8,211,616 B2

At Column 57, Line 9 (Approx.), Change "as long at" to --as long as--.

At Column 65, Line 1 (Above Structure), Change "[Chemical Formula 40.]" to --[Chemical Formula 41.]--.

At Column 69, Line 29 (Approx.), Change "1.4] In" to --1.4]. In--.

At Column 71, Line 3, After "excellent" insert --.--.

At Column 71, Line 5, After "low" insert --.--.